US009430001B2

(12) United States Patent
Kim et al.

(10) Patent No.: US 9,430,001 B2
(45) Date of Patent: Aug. 30, 2016

(54) MODULAR COMPUTING DEVICE

(71) Applicant: Microsoft Technology Licensing, LLC, Redmond, WA (US)

(72) Inventors: Young Soo Kim, Bellevue, WA (US); Timothy G. Escolin, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/675,288

(22) Filed: Mar. 31, 2015

(65) Prior Publication Data

US 2016/0195904 A1 Jul. 7, 2016

Related U.S. Application Data

(60) Provisional application No. 62/100,010, filed on Jan. 5, 2015.

(51) Int. Cl.
*G06F 1/16* (2006.01)

(52) U.S. Cl.
CPC ........... *G06F 1/1684* (2013.01); *G06F 1/1605* (2013.01); *G06F 1/1637* (2013.01)

(58) Field of Classification Search
CPC ............................. G06F 1/1637; G06F 1/1684
See application file for complete search history.

(56) References Cited

U.S. PATENT DOCUMENTS

| 4,960,256 A | 10/1990 | Chihara et al. |
| 5,168,426 A | 12/1992 | Hoving et al. |
| 5,909,357 A | 6/1999 | Orr |
| 6,118,663 A | 9/2000 | Fan |
| 6,144,888 A | 11/2000 | Lucas et al. |
| 6,903,927 B2 | 6/2005 | Anlauff |
| 7,152,126 B2 | 12/2006 | Sandy et al. |
| 7,221,572 B2 | 5/2007 | Arippol |
| 7,500,060 B1 | 3/2009 | Anderson et al. |

(Continued)

FOREIGN PATENT DOCUMENTS

| EP | 0132152 | 1/1985 |
| JP | H0934589 | 2/1997 |

(Continued)

OTHER PUBLICATIONS

"International Search Report and Written Opinion", Application No. PCT/US2015/043893, Nov. 30, 2015, 18 Pages.

(Continued)

*Primary Examiner* — Anthony Q Edwards
(74) *Attorney, Agent, or Firm* — Qudus Olaniran; Judy Yee; Micky Minhas

(57) ABSTRACT

Modular computing device techniques are described. In one or more implementations, a computing device includes a display modular component including a housing, a display device physically and communicatively coupled to the housing via a hinge, and one or more display hardware elements disposed within the housing that are configured to output a display for display by the display device. The computing device also includes a computing modular component including a housing that is physically and communicatively coupled to the display modular component, a processing system disposed within the housing, and memory disposed within the housing. The processing system is configured to execute instructions stored by the processing system to generate a user interface for display by the display device of the display modular component.

20 Claims, 19 Drawing Sheets

(56) References Cited

U.S. PATENT DOCUMENTS

| | | |
|---|---|---|
| 7,611,113 B2 | 11/2009 | Lai |
| 7,724,511 B2 | 5/2010 | Jacobs |
| 7,895,257 B2 | 2/2011 | Helal et al. |
| 8,259,437 B2 | 9/2012 | Vesely |
| 8,748,324 B1 | 6/2014 | Woo et al. |
| 8,798,675 B2 | 8/2014 | Salmon et al. |
| 2007/0058329 A1 | 3/2007 | Ledbetter et al. |
| 2007/0208892 A1 | 9/2007 | Betts-Lacroix et al. |
| 2008/0259551 A1 | 10/2008 | Gavenda et al. |
| 2013/0010418 A1* | 1/2013 | Flynn .................. G06F 1/16 361/679.21 |
| 2013/0242495 A1 | 9/2013 | Bathiche et al. |
| 2013/0329351 A1 | 12/2013 | Lin |
| 2016/0041582 A1 | 2/2016 | Kim et al. |

FOREIGN PATENT DOCUMENTS

| | | |
|---|---|---|
| WO | WO-2004114102 | 12/2004 |
| WO | WO-2010028399 | 3/2010 |
| WO | WO-2011093951 | 8/2011 |

OTHER PUBLICATIONS

"HP LP2475w 24-inch Widescreen LCD Monitor—Setting up the Monitor", Retrieved From: <http://h20565.www2.hp.com/portal/site/hpsc/template.PAGE/public/kb/docDisplay/?sp4ts.oid=3648442&spf_p.tpst=kbDocDisplay&spf_p.prp_kbDocDisplay=wsrp-navigationalState%3DdocId%253Demr_nac01504550-2%257CdocLocale%253D%257CcalledBy%253D&java, Jul. 17, 2014, 10 Pages.

Anthony,"CES 2014: Razer Shows off Wondrously Crazy (and Sadly Unrealistic) Fully Modular Oil-Cooled PC", Retrieved From: <http://www.extremetech.com/extreme/174338-ces-2014-razer-shows-off-wondrously-> Aug. 12, 2014, Jan. 8, 2014, 6 Pages.

Hachman,"Acer Announces Aspire R13, R14 Convertibles and Larger Switch Series 2-in-1s", Retrieved From: <http://www.pcworld.com/article/2601322/acer-announces-aspire-r13-414-convertibles-and-larger-switch-series-2-in-1s.html> Feb. 16, 2015, Sep. 3, 2014, 5 pages.

Lowensohn,"Project Ara: Hands-On With Google's Latest Modular Smartphone Prototype", Retrieved From: <http://www.theverge.com/2015/1/14/7547529/google-project-ara-prototype-hands-ontf> Feb. 9, 2015, Jan. 14, 2015, 10 pages.

Power,"Sony Vaio Flip 15", Retrieved From: <http://alwyns.blogspot.in/2013/10/sony-vaio-flip-15-october-20-2013-sonys.html> Aug. 8, 2014, Oct. 20, 2013, 4 Pages.

Thompson,"The Right Stuff: How a Communications Processor Became the Smarts of a Flight Computer", Retrieved From: <http://blogs.freescale.com/networking/2012/04/the-right-stuff-how-a-communications-processor-became-the-smarts-of-a-flight-computer>Feb. 12, 2015, Apr. 23, 2012, 12 pages.

Tyson,"Razer Project Christine Modular PC Design is Unveiled", Retrieved From: <http://hexus.net/tech/news/systems/64649-razer-project-christine-modular-pc-design-unveiled/> Feb. 6, 2015, Jan. 8, 2014, 3 pages.

Second Written Opinion, Application No. PCT/US2015/043893, May 4, 2016, 5 pages.

International Search Report and Written Opinion, Application No. PCT/US2015/067752, Jul. 4, 2016, 19 pages.

* cited by examiner

2200 —

2202
Obtain a plurality a plurality of modular components, each of the modular components having a respective housing configured to form a stackable arrangement, one to another

2204
Stack the plurality of modular components to form a computing device

*Fig. 22*

MODULAR COMPUTING DEVICE

PRIORITY APPLICATION

This application claims priority under 35 U.S.C. Section 119(e) to U.S. Provisional Patent Application No. 62/100,010, filed Jan. 5, 2015 and titled "Modular Computing Device," the entire disclosure of which is hereby incorporated by reference.

BACKGROUND

The range and functionality of hardware resources that are made available for use with a computing device is ever increasing. For example, faster processors, memories that support larger storage amounts, wireless communication devices that support increased bandwidth, and so on are being continually developed.

However, conventional techniques that made this increased functionality available to a user generally involved the replacement of a user's current device with a new device having this functionality. Thus, these conventional techniques can be expensive and thus avoided by a user, thereby limiting a device maker's opportunity to provide this increased functionality to users.

SUMMARY

Modular computing device techniques are described. In one or more implementations, a computing device includes a display modular component including a housing, a display device physically and communicatively coupled to the housing via a hinge, and one or more display hardware elements disposed within the housing that are configured to output a display for display by the display device. The computing device also includes a computing modular component including a housing that is physically and communicatively coupled to the display modular component, a processing system disposed within the housing, and memory disposed within the housing. The processing system is configured to execute instructions stored by the processing system to generate a user interface for display by the display device of the display modular component.

In one or more implementations, a display modular component includes a housing, a display device physically and communicatively coupled to the housing via a hinge, and one or more display hardware elements disposed within the housing and configured to output a display for display by the display device. The housing is configured to form a communicative and removable physical coupling to a plurality of other housings having hardware elements disposed therein that are configured to support functionality relating to the display.

In one or more implementations, a system includes a plurality of modular components, each of the modular components having a respective housing configured to form a stackable arrangement, one to another, and configured to be physically and communicative coupled to form a computing device.

In one or more implementations, a plurality of modular components are obtained, each of the modular components having a respective housing configured to form a stackable arrangement, one to another. The plurality of modular components are stacked to form a computing device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

FIG. 22 is a flow diagram depicting a procedure in an example implementation in which the modular computing device of FIG. 1 is assembled through stacking.

DETAILED DESCRIPTION

Overview

The rate at which an ever increasing functionality variety of functionality is made available to computing devices continues to increase. However, conventional techniques utilized to make this functionality available to users have typically relied on replacement of the computing device as a whole, which could be expensive and thus limit access of users to this ever increasing functionality.

Modular computing device techniques are described. In one or more implementations, a computing device is assembled from a plurality of modular components formed using respective housings that may be physically and communicatively coupled, one to another, without the use of tools to add desired functionality. For example, a display modular component may include a housing, a display device, and a power supply configured to power the display. A computing modular component may be attached to the display modular component to add processing and memory functionality, as well as receive power from the display modular component. Accessory modular components may also be attached, such as to support input via a natural user interface, add speakers, a battery, and so on.

Additionally, these modular components may also formed using modules themselves. For example, a computing modular component may include a housing having a processing system, another housing having a memory system, yet another housing having a wireless communication device, and so on. These housings may be configured to be "swappable" within the housing to change functionality as desired, such as to update the processing, memory, and/or network resources of the computing device. In this way, the computing device may be altered and changed readily by a user in an intuitive manner without requiring detailed knowledge of the hardware, further discussion of which may be found in relation to the following sections.

In the following discussion, an example environment is first described that may employ the modular computing device techniques described herein. Functionality, features, and concepts described in relation to the examples in the following section may be employed in the context of the procedures described herein. Further, functionality, features, and concepts described in relation to different procedures below may be interchanged among the different procedures and are not limited to implementation in the context of an individual procedure. Moreover, blocks associated with different representative procedures and corresponding figures herein may be applied together and/or combined in different ways. Thus, individual functionality, features, and concepts described in relation to different example environments, devices, components, and procedures herein may be used in any suitable combinations and are not limited to the particular combinations represented by the enumerated examples.

Example Environment

Figure 1:
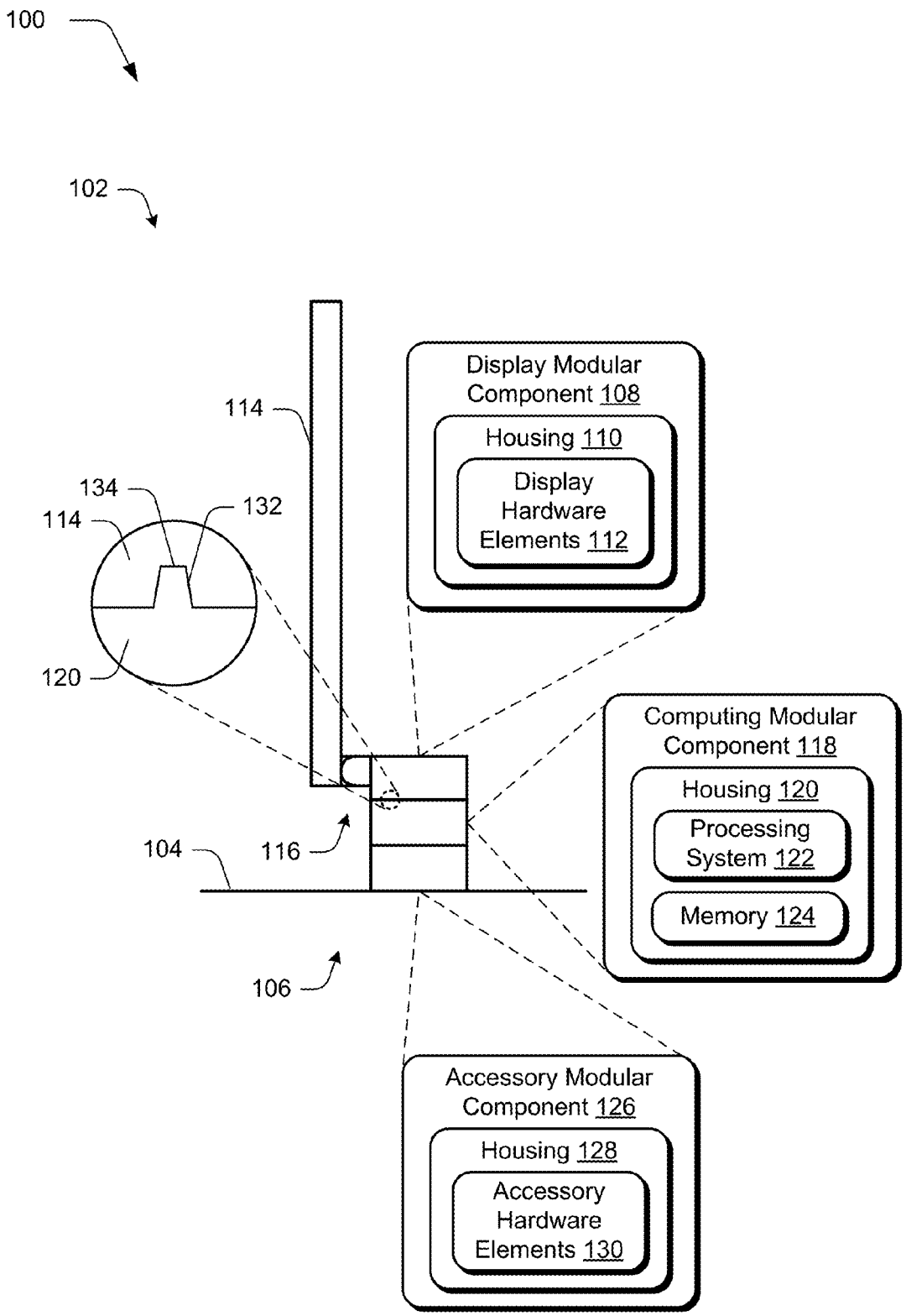
FIG. 1 is an illustration of an environment in an example implementation that is operable to employ the modular computing device techniques described herein.

FIG. 1 is an illustration of an environment 100 in an example implementation that is operable to employ techniques described herein. The illustrated environment 100 includes a computing device 102 having a modular configuration. The computing device 102 may assume a variety of configurations.

As illustrated, for instance, the computing device 102 assumes a "desktop" configuration in which the computing device is configured to be placed on a surface 104. Other examples are also contemplated, such as for attachment to a vertical surface (e.g., a cart or wall) as shown in the example 700 of FIG. 7, for use in mobile or television implementations as further described in relation to FIG. QQ, and so forth.

For example, a computing device may be configured as a computer that is capable of communicating over the network, such as a desktop computer, a mobile station, an entertainment appliance, a set-top box communicatively coupled to a display device, a wireless phone, a game console, and so forth. Thus, the computing device 102 may range from full resource devices with substantial memory and processor resources (e.g., personal computers, game consoles) to a low-resource device with limited memory and/or processing resources (e.g., traditional set-top boxes, hand-held game consoles). Additionally, although a single computing device 102 is shown, the computing device 102 may be representative of a plurality of different devices, such as a remote control and set-top box combination, an image capture device and a game console configured to capture gestures, and so on.

The computing device 102 includes a plurality of modular components 106 that may be physically and communicatively coupled, one to another, to provide interchangeability to access a variety of different functionality. Additionally, visual characteristics may be employed to indicate this different functionality, e.g., colors, graphics, and so on.

An example of a modular component 106 is a display modular component 108. The display modular component 108 includes a housing 110 having disposed therein one or more display hardware elements 112. The display hardware elements 112, for instance, may include hardware elements configured to generate an output for display on a display device 114 of the display modular component 108.

The display modular component 108 is communicatively and physically connected (e.g., rotationally) to a display device 114 via a hinge mechanism 116. The display device 114 may include a variety of functionality, such as to include touchscreen functionality to recognize gestures and other inputs. Rotation of the display device 114 in relation to the housing 110 of the display modular component 108 may be utilized to support a variety of different functionality, further discussion of which may be found in relation to FIG. 4.

Another example of a modular component 116 of the computing device 102 is illustrated as a computing modular component 118. The computing modular component 118 also includes a housing 120, separate from the housing 110 of the display modular component 108, which is physically and communicatively coupled to the display modular component 108. The computing modular component 118 is representative of functionality that may be added to the display modular component 108, which in this instance includes a processing system 122 and memory 124 as further described in relation to FIG. 2.

Yet another example of a modular component 106 of the computing device 102 is an accessory modular component 126. Like above, the accessory modular component 126 includes a housing 128 and accessory hardware elements 130 disposed therein. As the accessory modular component 126 may take a variety of configurations, so to can the accessory hardware elements 130.

For example, the accessory modular component 126 may be configured as an output device, such as speakers, a projector, and so on and as such the accessory hardware elements 130 may be configured to support this functionality. The accessory modular component 126 may also be configured as an input device, such as a natural user interface device as further described in relation to FIG. 3. Other configurations are also contemplated, such as to include a battery that may be used to power the computing modular component 118 and/or the display modular component 108, a battery that may be charged by the computing device 102 for use with another computing device, and so on.

Figure 7:
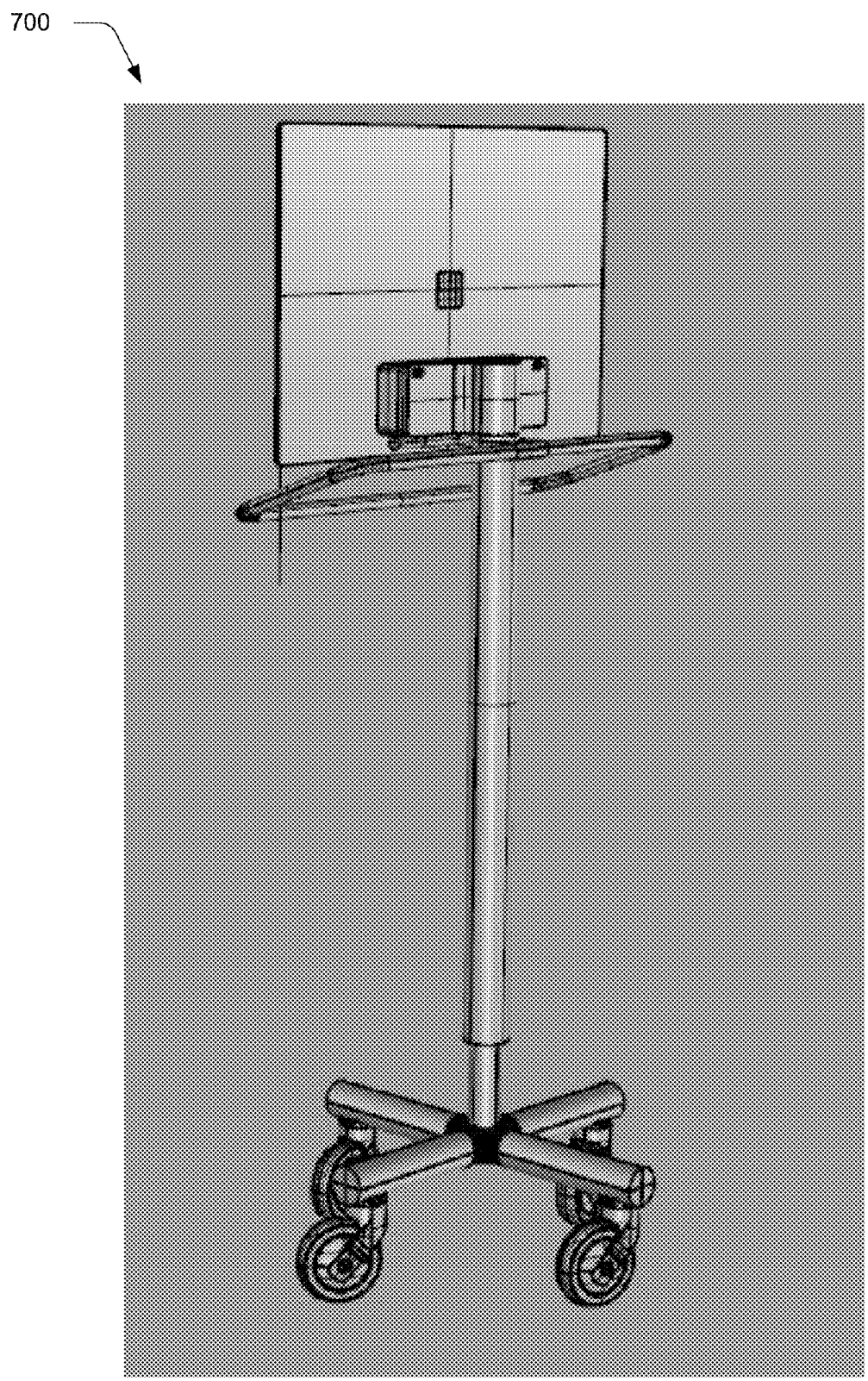
FIG. 7 depicts an example implementation showing the computing device of FIG. 1 as mounted to a vertical surface, which is part of a cart in this example.

In the illustrated example, the modular components 116 are illustrated as assuming a stacked configuration in which one modular component is stacked "on top" of another modular component when resting on a surface 104, attached vertically as shown in FIG. 7, and so on. Other configurations are also contemplated without departing from the spirit and scope thereof. The physical and communicative coupling between the modular components 116 may be accomplished in a variety of ways. For example, a magnetic coupling device may be included such that magnetism is utilized to form a physical connection between the components. The magnetic coupling device, for instance, may include a flux fountain in which a plurality of magnets are arranged (e.g., perpendicular to each other) to steer a field of flux "outward" away from the components to increase a securing force than would otherwise be the case if the magnets were aligned such that the fields were also aligned, one to another.

In another example, a protrusion 132 and cavity 134 arrangement may be utilized as illustrated. In the illustrated example, an axis corresponding to a height of the protrusion 132 defines a direction along which the modular components may be installed and removed, but causes mechanical binding in other directions to restrict removal in those directions. Other examples are also contemplated, such as mechanical latches and so on. In this way, a user may readily add, remove, and replace modular components from the computing device 102 to configure the computing device 102 to include desired functionality, further discussion of which may be found in relation to the following description and shown in a corresponding figure.

Figure 2:
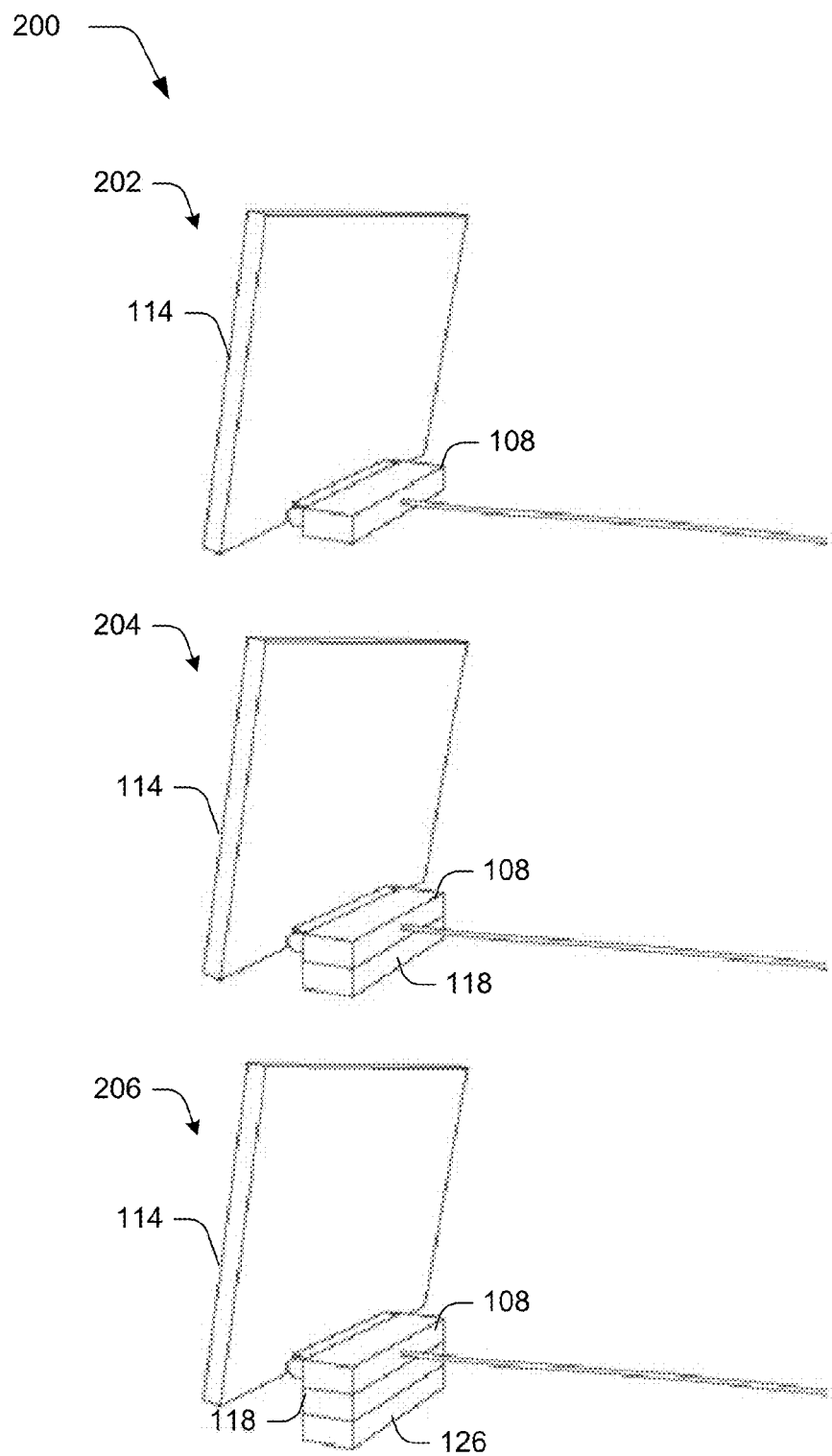
FIG. 2 depicts an example implementation showing different configurations of a computing device of FIG. 1 through addition or removal of modular components to or from the device.

FIG. 2 depicts an example implementation 200 showing different configurations of the computing device 102 of FIG. 1 through addition or removal of modular components from the device. This implementation 200 includes first, second, and third 202, 204, 206 examples of configurations of the computing device 102 of FIG. 1.

In the first example 202, the display modular component 108 is illustrated as being used alone without additional modular components. As illustrated, the display modular component 108 include a power supply and may include one or more inputs that may be utilized with another device, such a HDMI, display ports, USB ports, and so on. The display modular component 108 may also include a sufficient amount of ballast to counteract a weight of the display device 114 such that component 108 may be placed on a surface 104 as shown in FIG. 1 without tipping over, e.g., which may be accomplished using speakers, lead weights, and so on.

In one or more implementations, the display modular component 108 also includes functionality to execute an operating system, such as to be configured as a "thin" computing device to support a lightweight operating system, processor, and memory for mobile configurations. Addition of the computing modular component 118 may therefore be utilized to supplement this functionality in this example, such as to add processing, memory, and/or network resource functionality to support a "thick" or "rich" computing device configuration.

In the second example 204, the computing modular component 118 is added to the display modular component 108 through stacking to form a physical and communicative coupling between the components 108, 118. In this way, functionality of the computing modular component 118 may be added to the display modular component 108 and vice versa. For instance, the computing modular component 118 may be utilized to generate a user interface for output by the display device 114 and the display modular component 108 may be utilized to provide power to the computing modular component 118.

In the third example 206, the accessory modular component 126 is added to the computing modular component 118 through stacking to form a physical and communicative coupling between the display, computing, and accessory components 108, 118, 126. For example, the communicative and physical coupling may be formed between the accessory modular component 126 and the computing modular component 118 as previously described in relation to FIG. 1, e.g., without the use of tools through protrusions, magnetism, mechanical connections (e.g., a slidable latch), and so forth. A variety of different functionality may be added, such as battery power, input devices, and/or output devices, a natural user interface input device, and so on as previously described. Other accessory configurations are also contemplated, an example of which is described in the following and shown in a corresponding figure.

Figure 3:
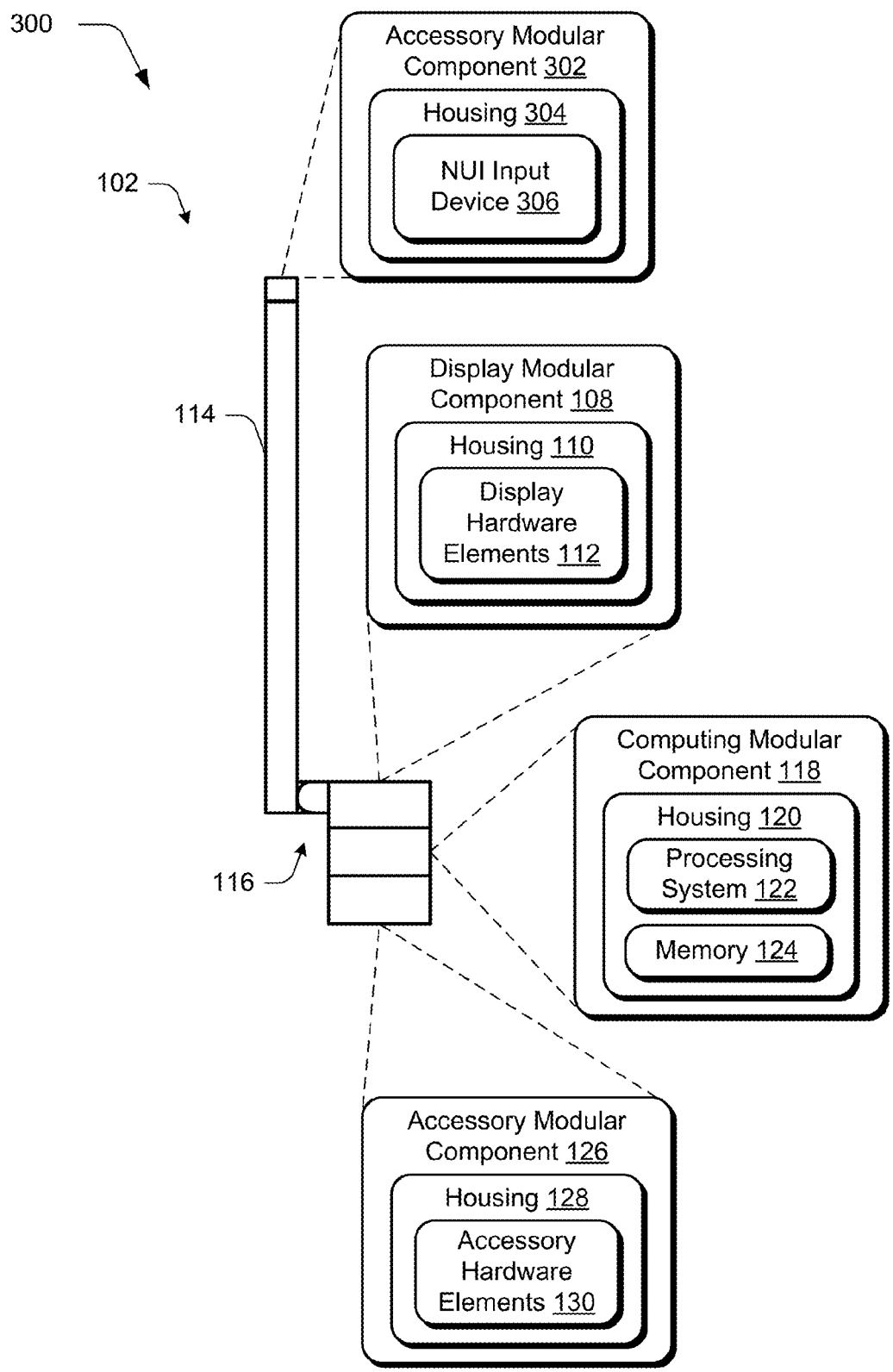
FIG. 3 depicts an example implementation in which a computing device of FIG. 1 also includes another accessory modular component.

FIG. 3 depicts an example implementation 300 in which the computing device 102 of FIG. 1 also includes another accessory modular component 302. In this example, a housing 304 of an accessory modular component 302 is physically and communicatively coupled to the display device 114 of the display modular component 108, e.g., through use of protrusions, magnetisms, mechanical latches, and so forth. Placement of the accessory modular component 302 at this location may be utilized to support a variety of different functionality, such as any one of the accessory functionality previously described.

In the illustrated example, the accessory is configured to support a natural user interface (NUI) input device 306 to support a natural user interface (NUI) that may recognize interactions that may not involve touch. For example, the NUI input device 306 may be configured in a variety of ways to detect inputs without having a user touch a particular device, such as to recognize audio inputs through use of a microphone. For instance, the NUI input device 306 may be configured to support voice recognition to recognize particular utterances (e.g., a spoken command) as well as to recognize a particular user that provided the utterances.

In another example, the NUI input device 306 that may be configured to support recognition of gestures, presented objects, images, and so on through use of a camera. The camera, for instance, may be configured to include multiple lenses so that different perspectives may be captured and thus determine depth. The different perspectives, for instance, may be used to determine a relative distance from the NUI input device 306 and thus a change in the relative distance.

In another example, a time-of-flight camera may be utilized to determine relative distances of objects, e.g., arms, hands, fingers, legs, torso, and head of a user. For instance, the NUI input device 306 may capture images that are analyzed to recognize one or more motions made by a user, including what body part is used to make the motion as well as which user made the motion. Motions may be identified as gestures by the NUI input device 306 to initiate a corresponding functions. Thus, the NUI input device 306 may be leveraged to support depth perception in a variety of different ways. The images captured by the NUI input device 306 may be leveraged to provide a variety of other functionality, such as techniques to identify particular users (e.g., through facial recognition), objects, and so on.

A variety of different types of gestures may be recognized, such a gestures that are recognized from a single type of input (e.g., a motion gesture) as well as gestures involving multiple types of inputs, e.g., a motion gesture and an object gesture made using an object such as a stylus. Thus, the NUI input device 306 may support a variety of different gesture techniques by recognizing and leveraging a division between inputs. It should be noted that by differentiating between inputs in the natural user interface (NUI), the number of gestures that are made possible by each of these inputs alone is also increased.

For example, although the movements may be the same, different gestures (or different parameters to analogous commands) may be indicated using different types of inputs. Thus, the NUI input device 306 may support a natural user interface that supports a variety of user interaction's that do not involve touch. Although illustrated as attached to the display device 114 in this example, functionality of the NUI input device 306 may also be incorporated as part of the accessory modular component 126.

Figure 4:
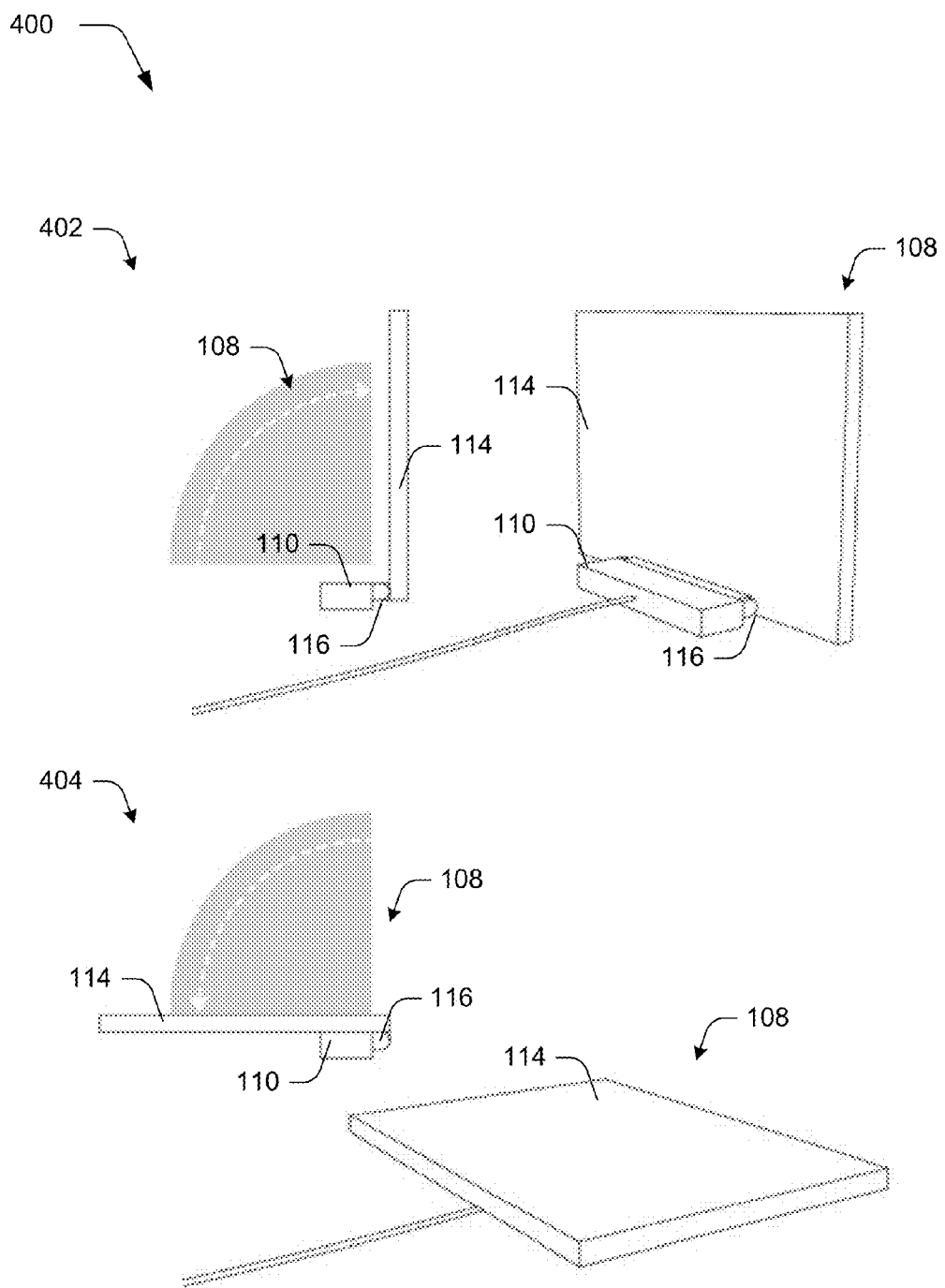
FIG. 4 depicts an example implementation in which movement of a display device in relation to a housing of a display modular component is shown.

The NUI input device 306 may be configured to support use in a variety of different configurations. For example, a camera of the NUI input device 206 may be configured to capture images and communicate the images to the computing modular component 118 to recognize one or more gestures as previously described. The camera may be configured to rotate in cooperation with rotation of the display device 114 as shown in FIG. 4. Further, this rotation may be performed automatically and without user intervention responsive to the rotation of the display device 114, e.g., through use of a motor. For example, the rotation may be performed automatically and without user intervention such that a line-of-sight is maintained between a user of the computing device and the camera, e.g., through detection of a user's face and corresponding rotation of the camera to keep the user's face in view.

FIG. 4 depicts an example implementation 400 in which movement of the display device in relation to the housing of the display modular component is shown. This implementation 400 is shown using first and second examples 402, 404. In the first example 402, the display device 114 is illustrated as generally perpendicular to an axis of the housing 110 of the display modular component 108 that is defined as corresponding to a surface of the housing 110 to which other modular components and connected and/or to a surface on which the housing 110 is to be placed upon. Thus, this may be thought of as an "upright" configuration such that a user may view the display device 114 in a manner that mimics interaction with a desktop computer.

In the second example 404, the display device 114 is rotated using the hinge mechanism 116 to "lay flat" against the surface of the housing 110 of the display modular component 108 that defined the axis described above. This may be thought of as a "writing configuration" in which a user may interact with touchscreen functionality of the display device 114, e.g., via gestures, a stylus, and so on. In this way, a user may comfortably interact with the display device to perform handwriting, drawing, and so on.

The hinge mechanism 116 may be configured in a variety of different ways. For example, the hinge mechanism 116 may be configured to support approximately 180 degrees of rotation or more. The hinge mechanism 116 may be configured as a friction hinge such that a desired angle is maintained. Additionally, the hinge may be configured as a split hinge mechanism 116 such that one part is connected to the housing 110 and another part is connected to the display device 114 such that a single joint is viewable by a user. Further, the hinge mechanism 116 may be embedded in the housing 110 and even hidden inside the housing 110. In one or more implementations, the hinge mechanism 116 may be configured to permit the display device 114 to slide into position in addition to the rotation, e.g., permit slidable movement in relation to the housing 110. For instance, the display device 114 may include a hinge on the back to allow the display device 116 to slide forward when rotated to an angle that permits touch inputs to be provided in a more comfortable manner to a user. A variety of other examples are also contemplated without departing from the spirit and scope thereof.

Figure 5:
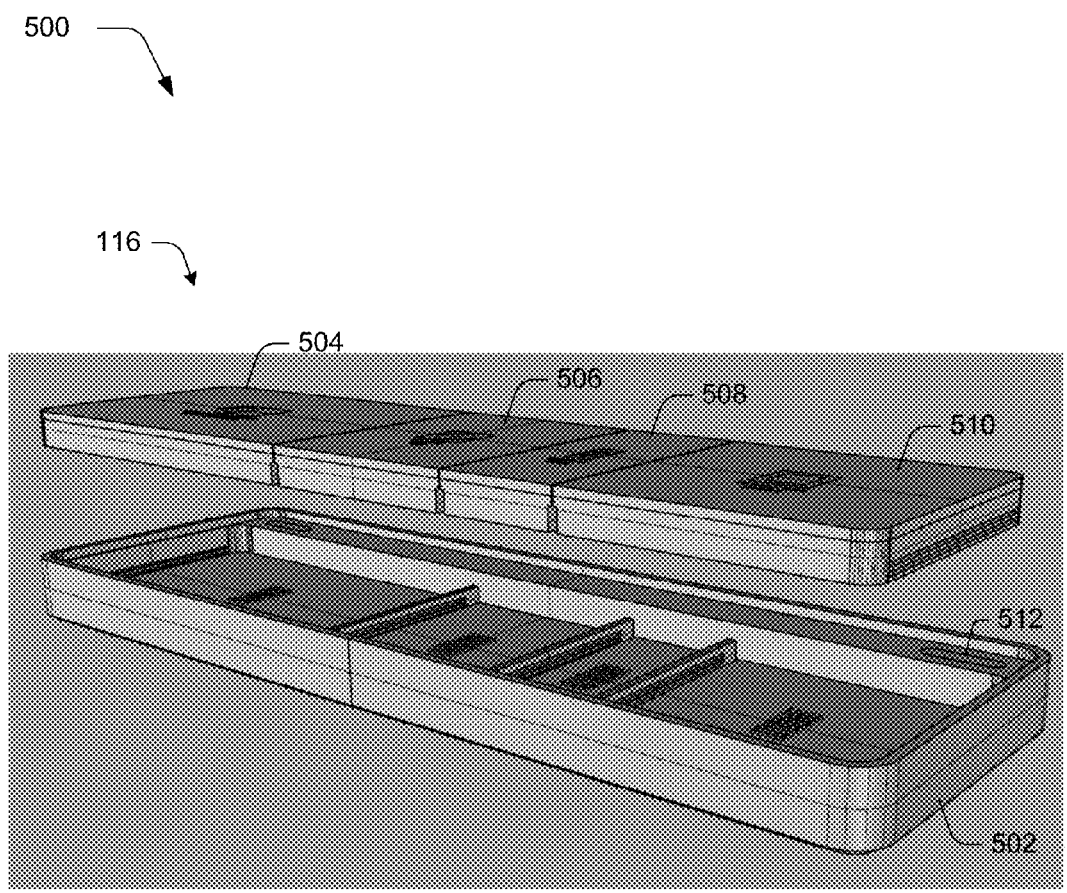
FIGS. 5 and 6 depicts example implementations in which a modular component of FIG. 1 includes housing disposed therein that are swappable to add or remove corresponding functionality to the modular component.
Figure 6:
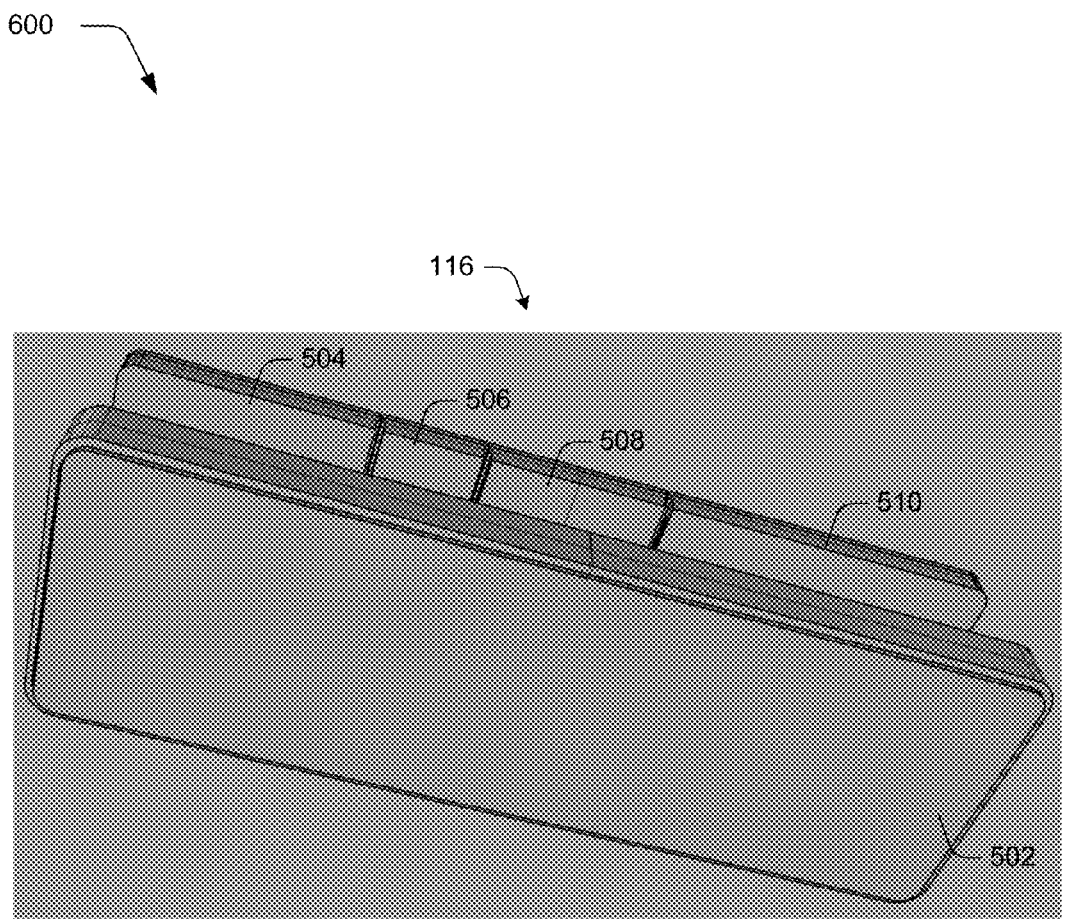

FIGS. 5 and 6 depicts example implementations 500, 600 in which a modular component includes housing disposed therein that are swappable to add or remove corresponding functionality to the modular component. In this example, a housing 502 of a modular component 116 is shown, such as any one of the display, computing, or accessory modular components 108, 118, 126, 302 of FIGS. 1 and 3. The housing 502 is configured to receive a plurality of other housings 504, 506, 508, 510 to be disposed therein such that different functionality may be "swapped" with the modular component and as such, not only is the modular component 116 itself interchangeable but so too is the functionality within the modular component 116.

In a computing modular component example 118, for instance, the housings 504-510 may correspond to memory, a wireless network functionality, a graphics processing unit, and a processing system. These housing 504-510 may be configured as pods that are placed within corresponding receptacles within the housing 502. Communicative and physical couplings may also be supported, e.g., through use of protrusions and cavities, mechanical attachment, magnetism (e.g., a flux fountain), and so forth. In this way, a user may simply remove and "drop in" a new one of the housings 504-510 to change functionality of the modular component 116. A common air conduit 512 may be utilized to facilitate heat management through the housings 502-510 as well as between modular components 116, e.g., the computing modular component may include a single fan that is utilized to cool other modular components 116.

Figure 8:
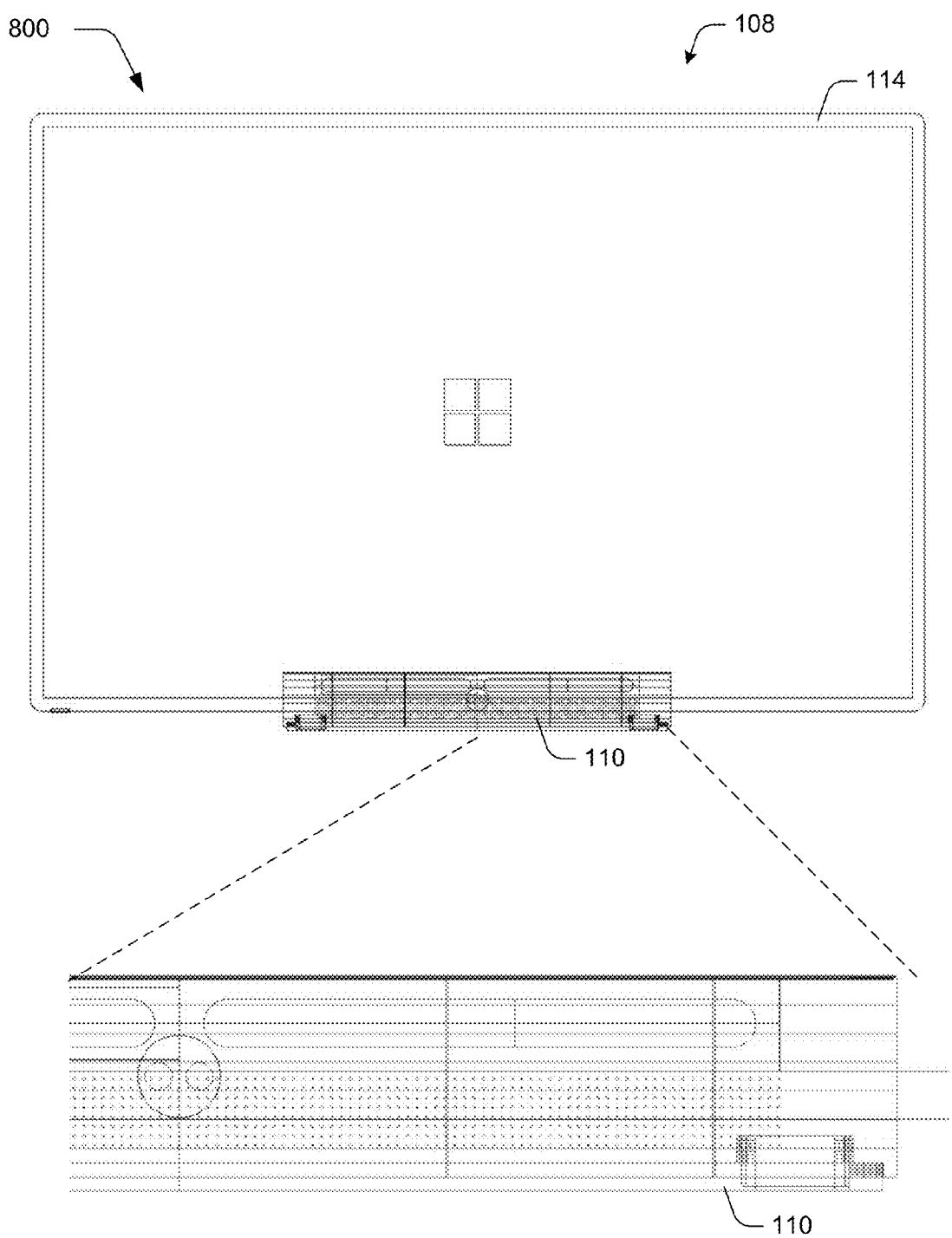
FIG. 8 depicts an example implementation showing a rear view of the display modular component of FIG. 1 along with an expanded view of the housing.

FIG. 8 depicts an example implementation 800 showing a rear view of the display modular component 108 of FIG. 1 along with an expanded view of the housing 110.

Figure 9:
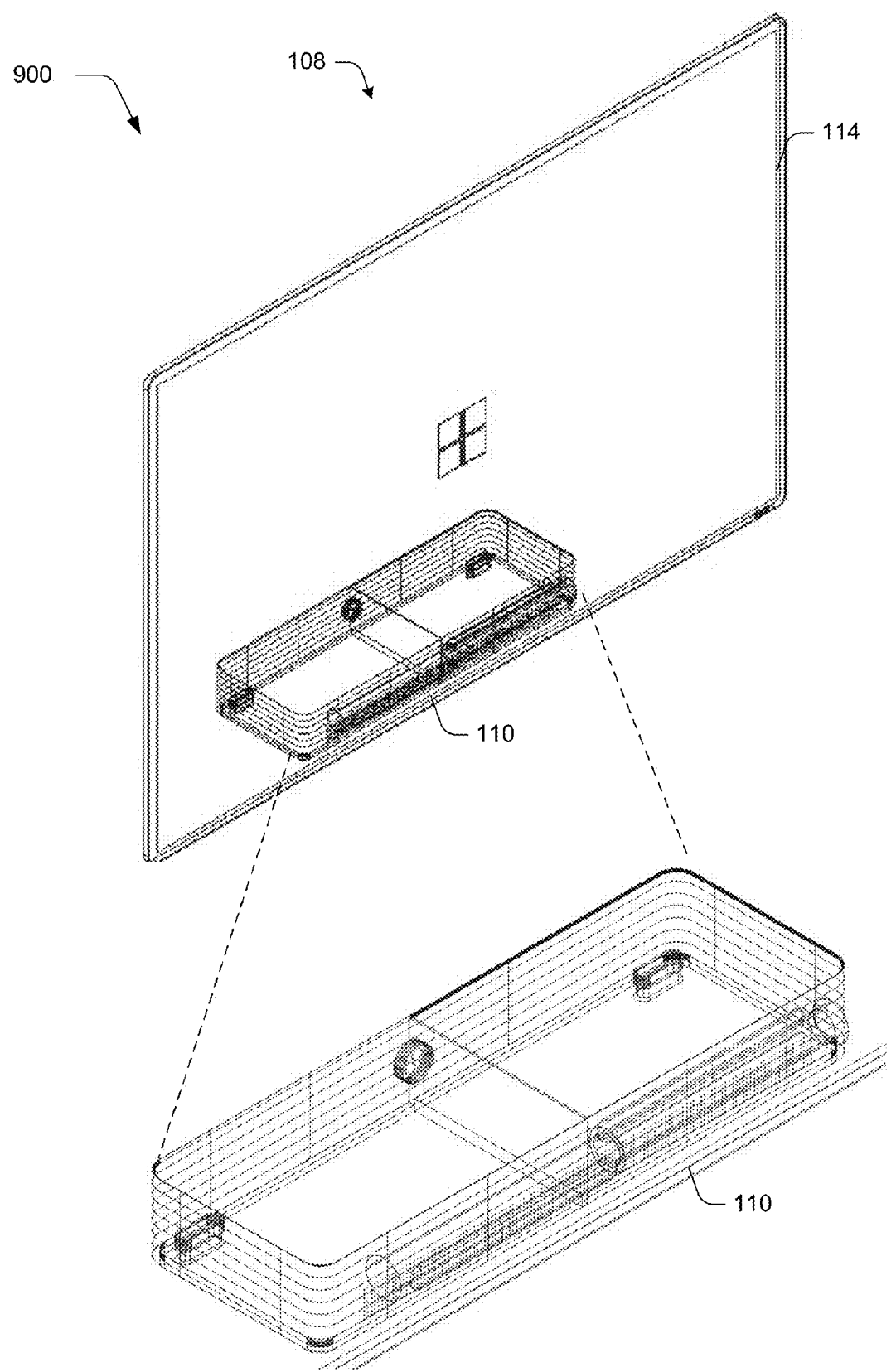
FIG. 9 depicts an example implementation showing an isometric view of the display modular component of FIG. 1 along with an expanded view of the housing.

FIG. 9 depicts an example implementation 900 showing an isometric view of the display modular component 108 of FIG. 1 along with an expanded view of the housing 110.

Figure 10:
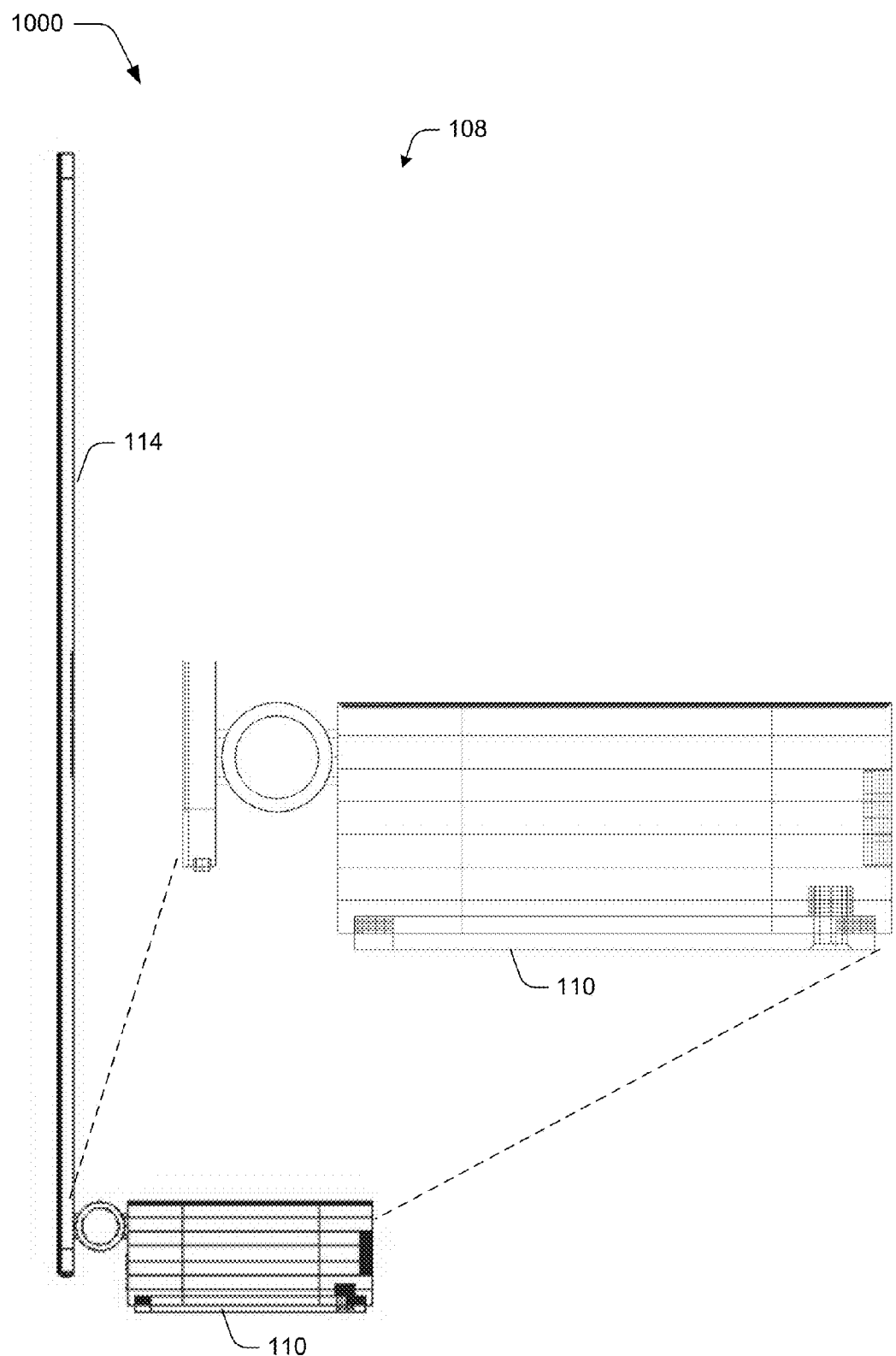
FIG. 10 depicts an example implementation showing a side view of the display modular component of FIG. 1 along with an expanded view of the housing.

FIG. 10 depicts an example implementation 1000 showing a side view of the display modular component 108 of FIG. 1 along with an expanded view of the housing 110.

Figure 11:
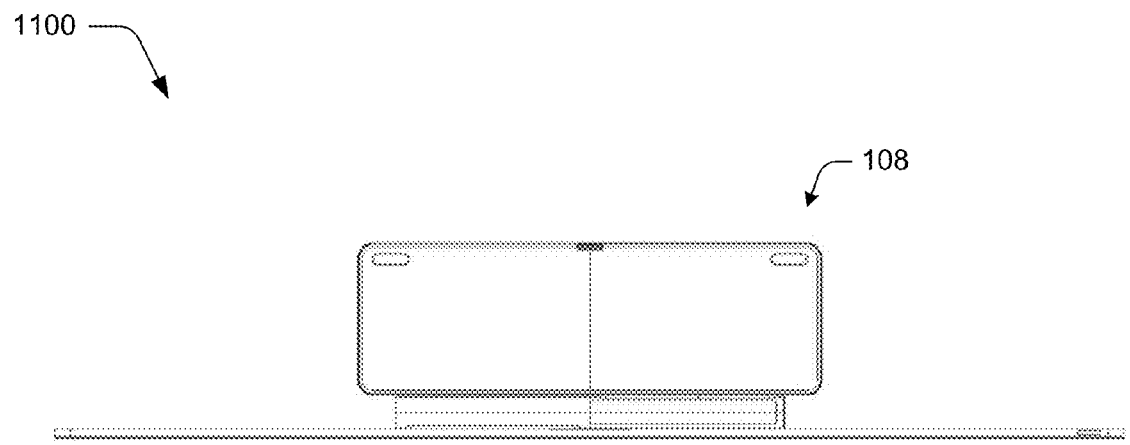
FIG. 11 depicts an example implementation showing a top view of the display modular component of FIG. 1.

FIG. 11 depicts an example implementation 1100 showing a top view of the display modular component 108 of FIG. 1.

Figure 12:
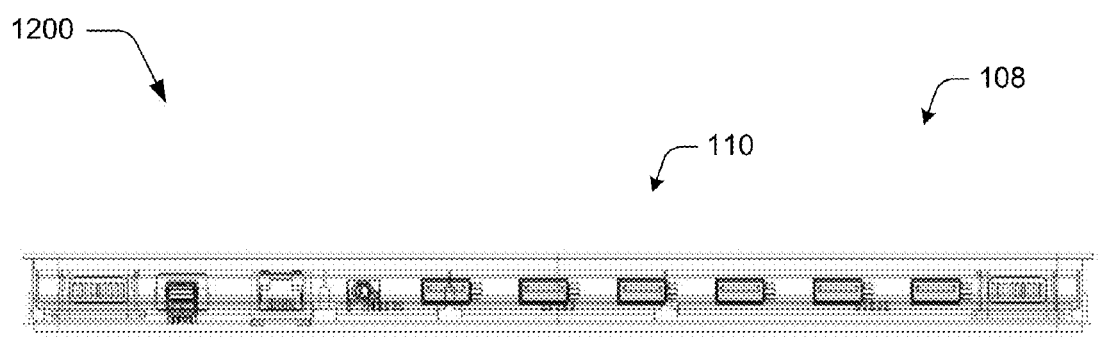
FIG. 12 depicts an example implementation showing a rear view of the housing of the display modular component of FIG. 1.

FIG. 12 depicts an example implementation 1200 showing a rear view of the housing 110 of the display modular component 108 of FIG. 1.

Figure 13:
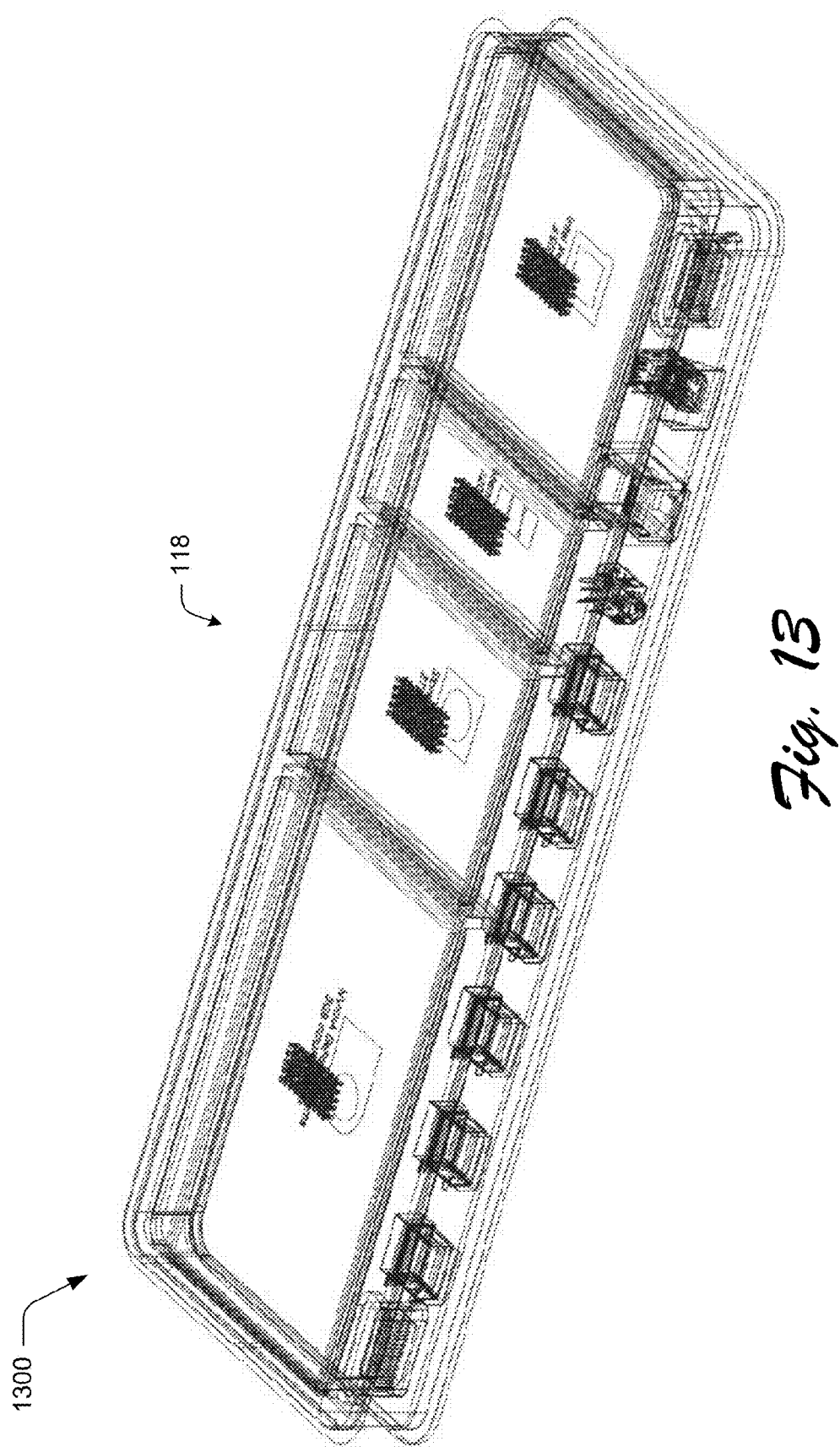
FIG. 13 depicts an example implementation showing an isometric view of the computing modular component of FIG. 1.

FIG. 13 depicts an example implementation 1300 showing an isometric view of the computing modular component 118 of FIG. 1.

Figure 14:
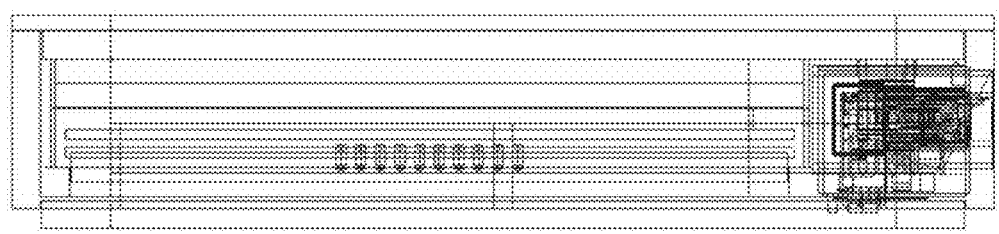
FIG. 14 depicts an example implementation showing a side view of the computing modular component of FIG. 1.

FIG. 14 depicts an example implementation 1400 showing a side view of the computing modular component 118 of FIG. 1.

Figure 15:
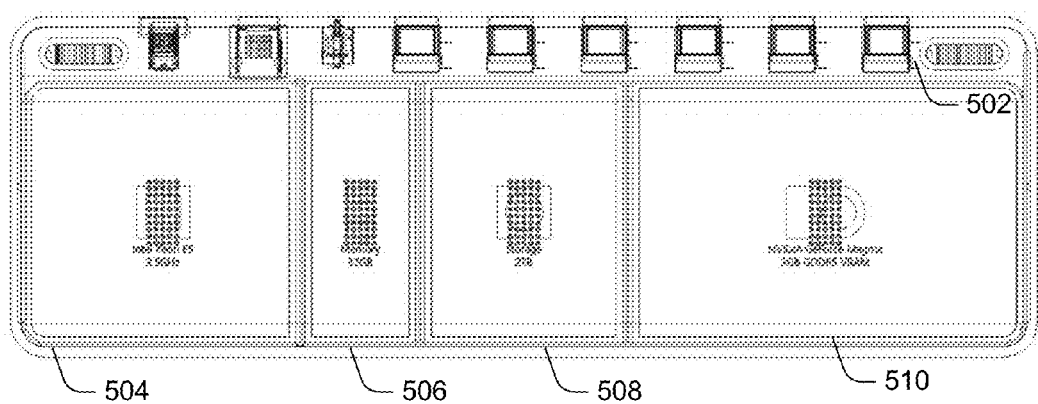
FIG. 15 depicts an example implementation showing a top view of the computing modular component of FIG. 1.
Figure 16:
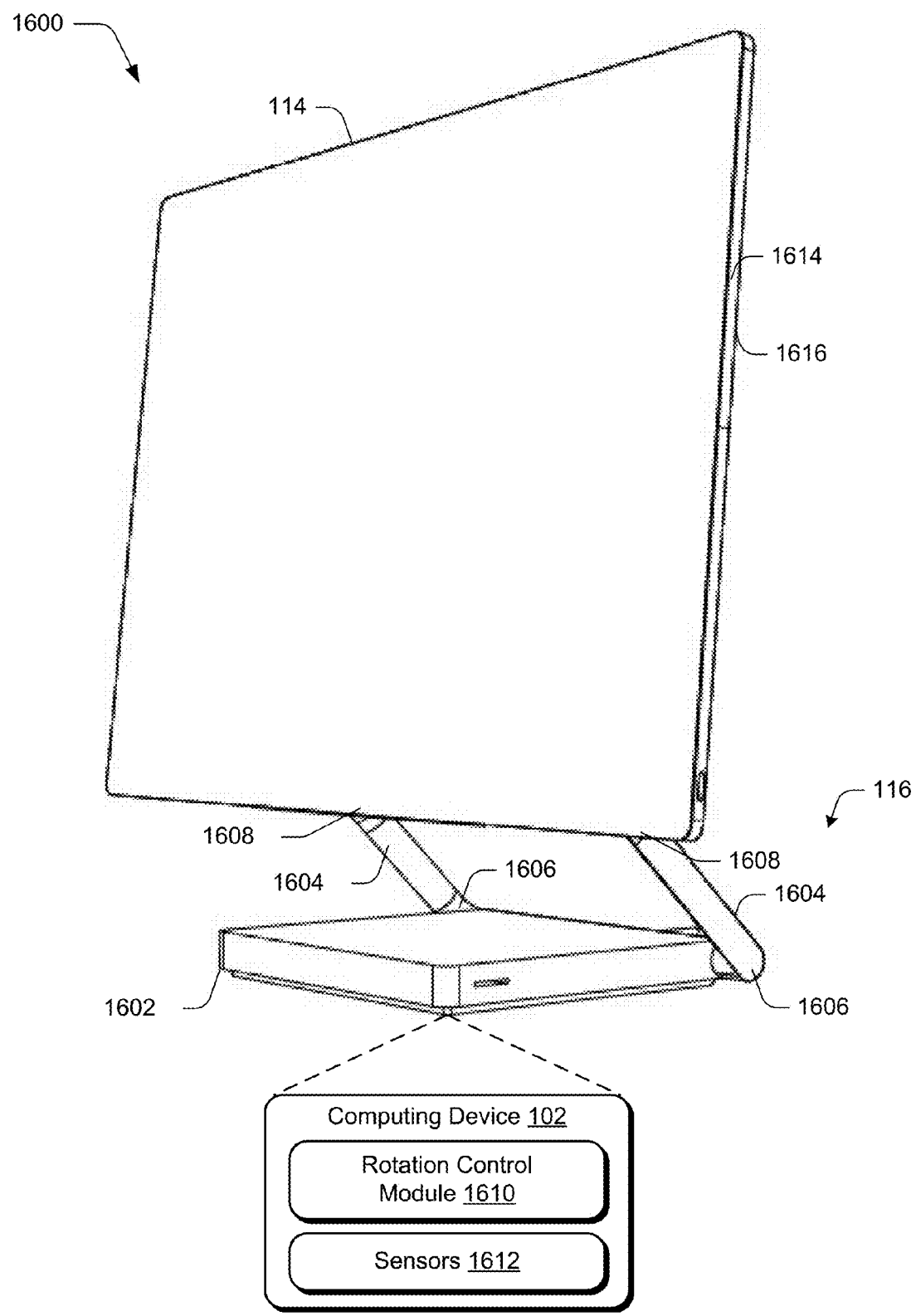
FIGS. 16-21 depict additional example implementations of the computing device.
Figure 17:
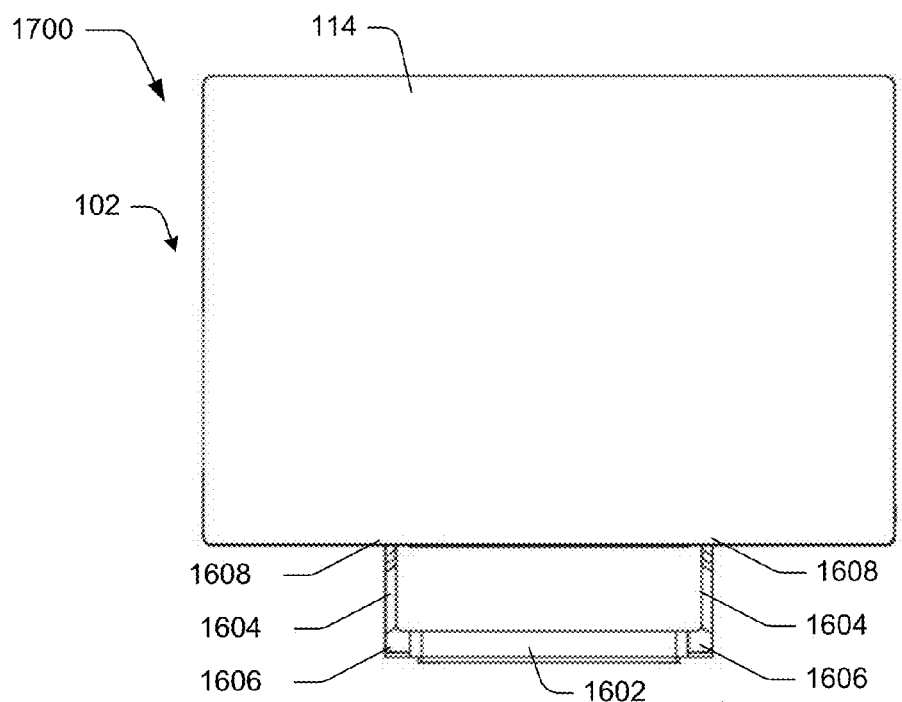
Figure 18:
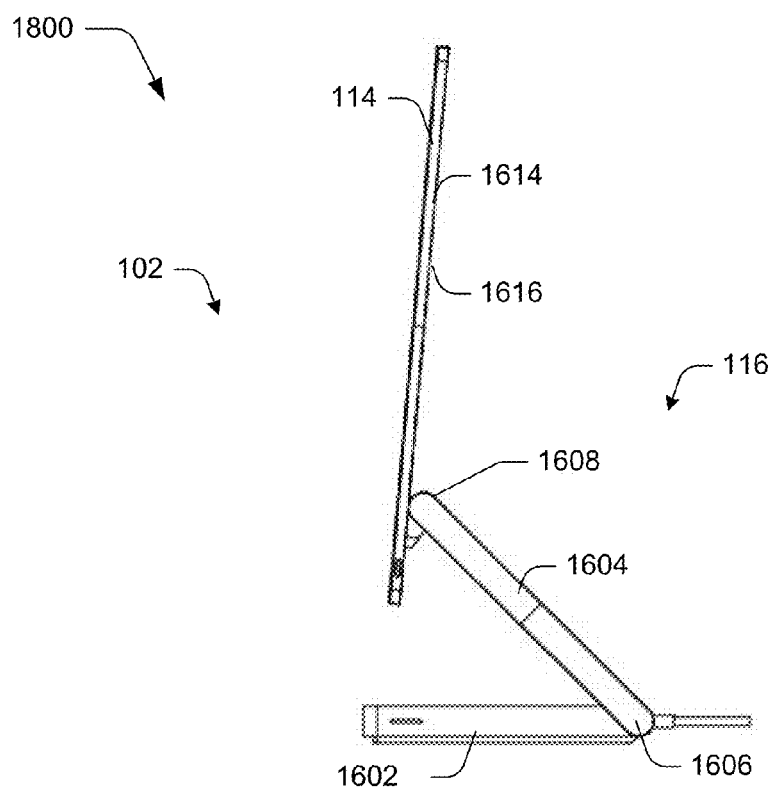

FIG. 15 depicts an example implementation 1500 showing a top view of the computing modular component 118 of FIG. 1.

FIGS. 16-21 depict additional example implementations 1600, 1700, 1800, 1900, 2000, 2100 of the computing device 102. The computing device 102 in this example includes a base 1602, which may be modular as further described below.

The computing device 102 is connected to the base 1602 using a hinge mechanism 116. In this example, the hinge mechanism 116 includes a plurality of members 1604. First rotational devices 1606 are used to connect the members 1604 of the hinge mechanism 116 to the base 1602 and second rotational devices 1608 are used to connect the members 1604 of the hinge mechanism 116 to the display device 114.

The first and second rotational devices 1606, 1608 are configurable in a variety of ways. For example, clutches (e.g., electromagnetic, mechanical, and so on) are includable and controlled by a rotation control module 1610. The rotation control module 1610 is configured to leverage sensors 1612 to detect when to engage and disengage the clutches.

Figure 21:
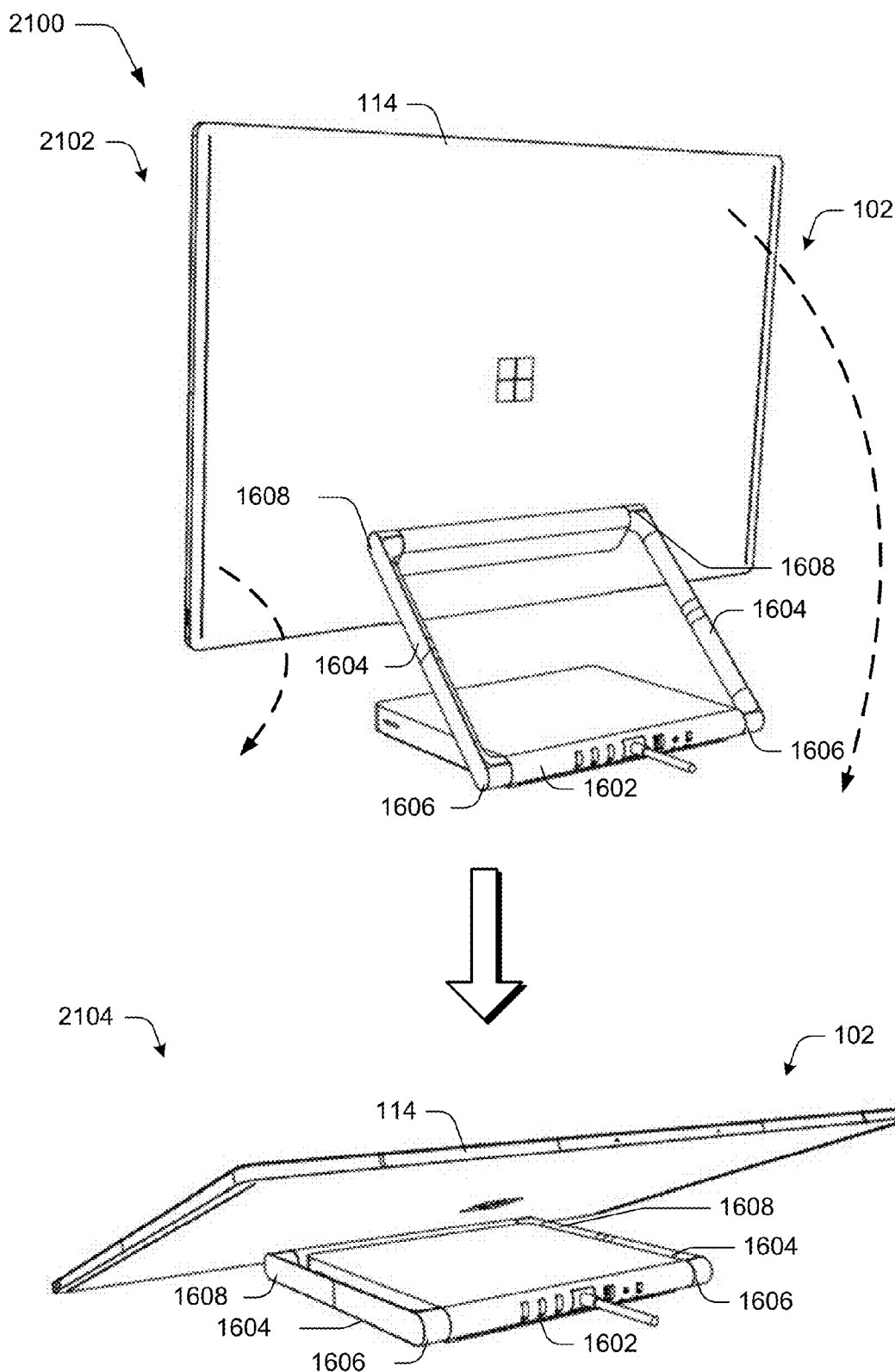

FIG. 21 depicts an example implementation 2100 in which the display device 114 is positioned in relation to the base 1602 using first and second stages 2102, 2104. The sensors 1612 may include touchscreen sensors configured as part of the display device, at a side 1614 of a housing of the display device 114, at a rear 1616 that is disposed on an opposing side to that of a display of the display device 114, and so forth.

An output of the sensors 1616, when processed by the rotation control module 1610 is usable to detect when to permit rotation of the first and second rotation devices 1606, 1608. For example, the rotation control module 1610 may detect that the display device 114 is being grasped by a hand of a user, and in response disengage the first and second rotation devices 1606, 1608, allowing the display device 114 to be positioned as desired in relation to the base 1602 as described by a user.

When so positioned, the user may release the grip, which is detected by the rotational control module 1610 using the sensors 1612 and in response causes clutches of the first and second rotation devices 1606, 1608 to re-engage. In this way, the display device 114 may be efficiently positioned by a single hand of a user as desired, even in instances where the display device 114 has a relatively large size, e.g., 24 inches and larger.

Additionally, the rotation control module 1610 may be configured to protect the computing device, such as to permit or prevent certain configurations to avoid configurations in which the display device 114 makes contact with the base 1602, is off-balance, restricts a lower edge of the display device 114 from making contact with a surface on which the base 1602 rests, and so forth.

Returning to FIG. 17, a front view of the computing device 102 is shown. In this example, the display device 114 includes a "glass to the edge" configuration in which the display reaches to an edge between a front and side surfaces. The display device 114 has a thickness of less than nine millimeters (e.g., 8.5 millimeters), and includes microphones, a three-dimensional camera as part of the display, speakers and a rubber bumper along the bottom, removable storage (e.g., SD) and a USB connection along the side.

Figure 19:
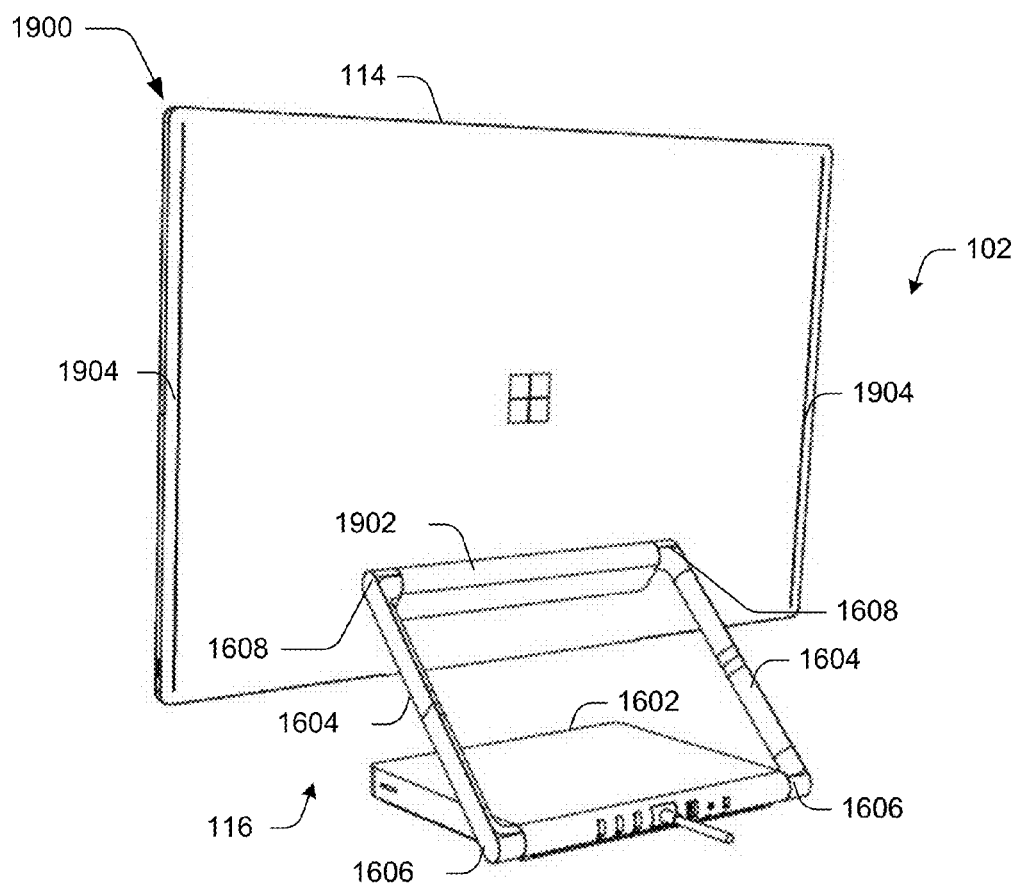
Figure 20:
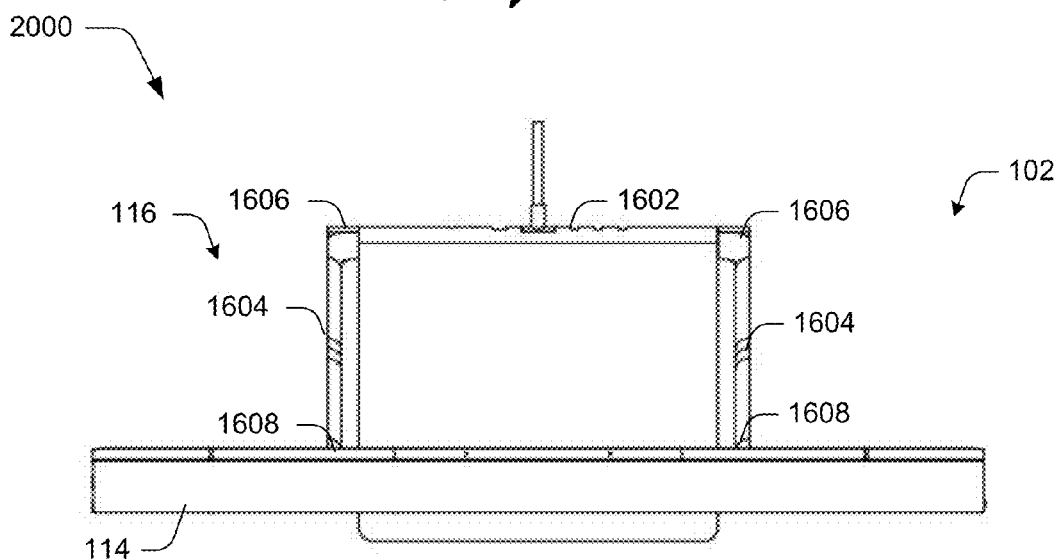

FIG. 19 depicts a rear of the computing device 102. In this example, a connection portion 1902 is shown that support a connection between the hinge mechanism 116 and the display device 114. The display device 114 has a curved rear housing, which provides stiffness and torsional rigidity across the surface of the display of the display device 114. Backlight LEDs or other light output devices 1904 are included at the sides that may be used to provide a complementary light output to which is displayed by the display device 114.

The connection portion 1902 in this example has a wedge shape, which may be used to housing hardware components of the computing device 102. In one implementation, the connection portion 1902 is permanently fixed to the display device 114. In another example, the connection portion 1902 is removable such that the display device 102 is separable from the connection portion 1902.

For example, the display device 102 may be configured as a tablet computer that is removably connected to the connection portion 1902 and thus the base 1602 of the computing device 102. The rotational control module 1610, for instance, may be configured to detect that a user has grasped the display device 114 via a single hand and thus permit rotation and when grasped by two hands cause separation of the connection portion and the display device 114. In another instance, the rotational control module 1610 may be configured to detect that a user has grasped the display device 114 using two fingers and thus permit rotation and when grasped by more than two fingers cause separation of the connection portion and the display device 114

The base 1602 may include hardware components to complement tablet functionality of the display device 114, such as additional hardware, data storage, and/or network connectivity. The display device 114 may be communicatively coupled to the base 1602 in a variety of ways, such as a wired connection through the members 1604, a wireless connection, and so forth.

The computing device 102 may include a variety of other features. For example, a keyboard may be included on a surface of the base 1602. Additionally, a projector may be included on the display device 114 and/or base to project an image of a keyboard with which user interaction is detected through use of a three-dimensional camera. The base 1602 may also include stepped edges to support the modular configuration previously described as well as a thermal system, such as to draw in air from a front and exhaust through the sides and back.

Example Procedures

The following discussion describes modular computing device techniques that may be implemented utilizing the previously described systems and devices. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference will be made to FIGS. 1-15.

FIG. 22 is a flow diagram depicting a procedure in an example implementation in which the modular computing device of FIG. 1 is assembled through stacking. A plurality a plurality of modular components 116 are obtained, each of the modular components having a respective housing configured to form a stackable arrangement, one to another (block 2202). The plurality of modular components 116 are stacked to form a computing device 102 (block 2204).

Example System and Device

Figure 23:
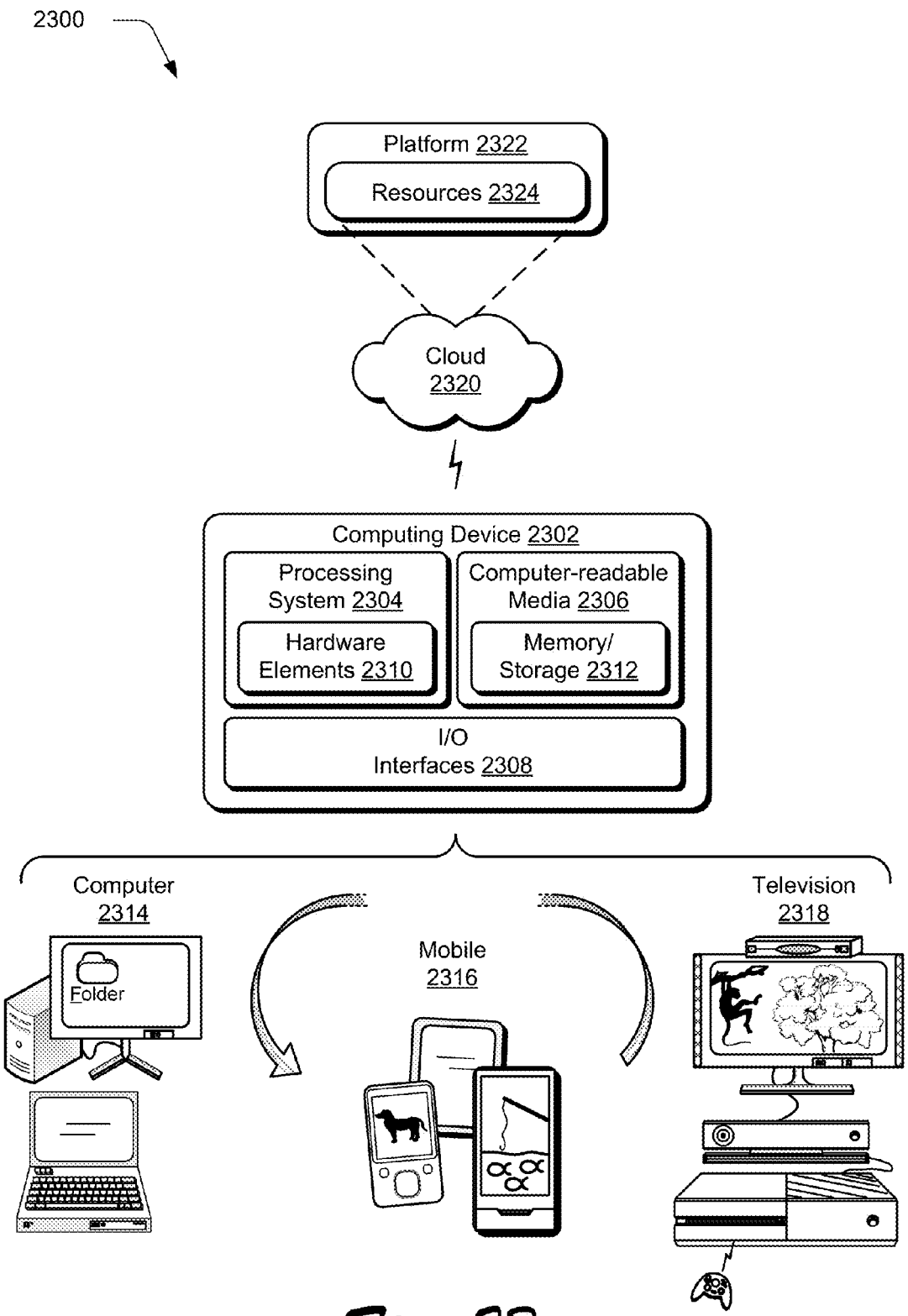
FIG. 23 illustrates an example system including various components of an example device that can be implemented as any type of computing device as described with reference to FIGS. 1-16 to implement embodiments of the techniques described herein.

FIG. 23 illustrates an example system generally at 2300 that includes an example computing device 2302 that is representative of one or more computing systems and/or devices that may implement the various techniques described herein. The computing device 2302 may be, for example, a server of a service provider, a device associated with a client (e.g., a client device), an on-chip system, and/or any other suitable computing device or computing system.

The example computing device 2302 as illustrated includes a processing system 2304, one or more computer-readable media 2306, and one or more I/O interface 2308 that are communicatively coupled, one to another. Although not shown, the computing device 2302 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 2304 is representative of functionality to perform one or more operations using hardware. Accordingly, the processing system 2304 is illustrated as including hardware element 2310 that may be configured as processors, functional blocks, and so forth. This may include implementation in hardware as an application specific integrated circuit or other logic device formed using one or more semiconductors. The hardware elements 2310 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 2306 is illustrated as including memory/storage 2312. The memory/storage 2312 represents memory/storage capacity associated with one or more computer-readable media. The memory/storage component 2312 may include volatile media (such as random access memory (RAM)) and/or nonvolatile media (such as read only memory (ROM), Flash memory, optical disks, magnetic disks, and so forth). The memory/storage component 2312 may include fixed media (e.g., RAM, ROM, a fixed hard drive, and so on) as well as removable media (e.g., Flash memory, a removable hard drive, an optical disc, and so forth). The computer-readable media 2306 may be configured in a variety of other ways as further described below.

Input/output interface(s) 2308 are representative of functionality to allow a user to enter commands and information to computing device 2302, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 2302 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 2302. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 2302, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 2310 and computer-readable media 2306 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 2310. The computing device 2302 may be configured to implement particular instructions and/or functions corresponding to the software and/or hardware modules. Accordingly, implementation of a module that is executable by the computing device 2302 as software may be achieved at least partially in hardware, e.g., through use of computer-readable storage media and/or hardware elements 2310 of the processing system 2304. The instructions and/or functions may be executable/operable by one or more articles of manufacture (for example, one or more computing devices 2302 and/or processing systems 2304) to implement techniques, modules, and examples described herein.

As further illustrated in FIG. 23, the example system 2300 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 2300, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link.

In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 2302 may assume a variety of different configurations, such as for computer 2314, mobile 2316, and television 2318 uses. Each of these configurations includes devices that may have generally different constructs and capabilities, and thus the computing device 2302 may be configured according to one or more of the different device classes. For instance, the computing device 2302 may be implemented as the computer 2314 class of a device that includes a personal computer, desktop computer, a multi-screen computer, laptop computer, netbook, and so on.

The computing device 2302 may also be implemented as the mobile 2316 class of device that includes mobile devices, such as a mobile phone, portable music player, portable gaming device, a tablet computer, a multi-screen computer, and so on. The computing device 2302 may also be implemented as the television 2318 class of device that includes devices having or connected to generally larger screens in casual viewing environments. These devices include televisions, set-top boxes, gaming consoles, and so on.

The techniques described herein may be supported by these various configurations of the computing device 2302 and are not limited to the specific examples of the techniques described herein. This functionality may also be implemented all or in part through use of a distributed system, such as over a "cloud" 2320 via a platform 2322 as described below.

The cloud 2320 includes and/or is representative of a platform 2322 for resources 2324. The platform 2322 abstracts underlying functionality of hardware (e.g., servers) and software resources of the cloud 2320. The resources 2324 may include applications and/or data that can be utilized while computer processing is executed on servers that are remote from the computing device 2302. Resources 2324 can also include services provided over the Internet and/or through a subscriber network, such as a cellular or Wi-Fi network.

The platform 2322 may abstract resources and functions to connect the computing device 2302 with other computing devices. The platform 2322 may also serve to abstract scaling of resources to provide a corresponding level of scale to encountered demand for the resources 2324 that are implemented via the platform 2322. Accordingly, in an interconnected device embodiment, implementation of functionality described herein may be distributed throughout the system 2300. For example, the functionality may be implemented in part on the computing device 2302 as well as via the platform 2322 that abstracts the functionality of the cloud 2320.

Conclusion

Example implementations described herein include, but are not limited to, one or any combinations of one or more of the following examples:

In one or more examples, a computing device comprises: a display modular component including a housing, a display device physically and communicatively coupled to the housing via a hinge, and one or more display hardware elements disposed within the housing and configured to output a display for display the display device; and a computing modular component including a housing that is physically and communicatively coupled to the display modular component, a processing system disposed within the housing, and memory disposed within the housing, the processing system configured to execute instructions stored by the processing system to generate a user interface for display by the display device of the display modular component.

An example as described alone or in combination with any of the above or below examples, wherein the computing modular component is configured to be connected to the display modular component via one or more protrusions that are received via cavities for form a mechanical attachment.

An example as described alone or in combination with any of the above or below examples, wherein the mechanical attachment is formed such that off-axis removal causes mechanical binding of the one or more protrusions within respective said cavities.

An example as described alone or in combination with any of the above or below examples, wherein the computing modular component is configured to be connected to the display modular component via magnetic attachment support by a magnetic attachment device.

An example as described alone or in combination with any of the above or below examples, wherein the magnetic attachment device include a flux fountain.

An example as described alone or in combination with any of the above or below examples, wherein the display modular component and the computing device modular component share a common air conduit that is configured to facilitate heat management of the display modular component and the computing device modular component.

An example as described alone or in combination with any of the above or below examples, wherein the communicative connection is configured such that the computing device modular component is configured to receive power from the display modular component.

An example as described alone or in combination with any of the above or below examples, wherein the display modular component includes one or more inputs that are configured to permit display from a device without the computing modular component being connected to the display modular component.

An example as described alone or in combination with any of the above or below examples, wherein the housings of the display modular component and the computing modular component have a stackable arrangement.

An example as described alone or in combination with any of the above or below examples, wherein the stackable arrangement is configured such that the housing of the computing modular component is configured for placement against a surface and the housing of the display modular component is stacked on top of the housing of the computing modular component.

An example as described alone or in combination with any of the above or below examples, wherein the hinge of the display modular component is configured to support 180 degrees of rotation.

An example as described alone or in combination with any of the above or below examples, wherein the display modular component has a sufficient amount of weight to counteract a weight of the display device such that the display device is rotatable via the hinge without tipping over.

An example as described alone or in combination with any of the above or below examples, wherein the display modular component is configured to be communicatively coupled to a plurality of computing modular components having different functionality, each of the plurality of computing modular components having a different visual characteristic, one to another, indicative of the different respective said functionality.

An example as described alone or in combination with any of the above or below examples, further comprising an accessory modular component including a housing that is configured to be physically and communicatively coupled to the computing modular component.

An example as described alone or in combination with any of the above or below examples, wherein the accessory modular component includes a battery that is configured to power the computing modular component and the display modular component.

An example as described alone or in combination with any of the above or below examples, wherein the battery is chargeable by the computing device, removable, and usable to power a different computing device.

An example as described alone or in combination with any of the above or below examples, wherein the accessory modular component includes an output device.

An example as described alone or in combination with any of the above or below examples, wherein the accessory modular component includes an output device.

An example as described alone or in combination with any of the above or below examples, further comprising a natural user interface modular component including a housing that is configured to be physically and communicatively coupled to the display device of the display modular component.

An example as described alone or in combination with any of the above or below examples, wherein the natural user interface modular component includes a microphone that is configured to detect speech of a user and communicate the speech to the computing modular component to recognize one or more utterances of a user.

An example as described alone or in combination with any of the above or below examples, wherein the natural user interface modular component includes a camera that is configured to capture images and communicate the images to the computing modular component to recognize one or more gestures.

An example as described alone or in combination with any of the above or below examples, wherein the camera of the natural user interface modular component is configured to rotate in cooperation with rotation of the display device.

An example as described alone or in combination with any of the above or below examples, wherein the rotation of the camera is performed automatically and without user intervention responsive to the rotation of the display device.

An example as described alone or in combination with any of the above or below examples, wherein the rotation of the camera is performed using a motor.

An example as described alone or in combination with any of the above or below examples, wherein the rotation of the camera is performed automatically and without user intervention such that a line-of-sight is maintained between a user of the computing device and the camera.

An example as described alone or in combination with any of the above or below examples, wherein the housing of the computing modular component is configured to removably receive a housing including the processing system disposed therein and a housing including the memory disposed therein, the housings including the processing system and the memory being swappable within the housing of the computing modular component by a user without using tools.

An example as described alone or in combination with any of the above or below examples, wherein the housing of the computing modular component is configured to removably receive a housing including wireless communication device that is swappable within the housing of the computing modular component.

An example as described alone or in combination with any of the above or below examples, wherein the housings including the processing system and the memory are physically and communicatively coupled to and within the housing of the computing modular component.

An example as described alone or in combination with any of the above or below examples, wherein the housings including the processing system and the memory are physically and communicatively coupled to and within the housing of the computing modular component via one or more protrusions that are received via cavities to form a mechanical attachment.

An example as described alone or in combination with any of the above or below examples, wherein the mechanical attachment is formed such that off-axis removal causes mechanical binding of the one or more protrusions within respective said cavities.

An example as described alone or in combination with any of the above or below examples, wherein the housings including the processing system and the memory are physically and communicatively coupled to and within the housing of the computing modular component via magnetic attachment supported by a magnetic attachment device.

An example as described alone or in combination with any of the above or below examples, wherein the magnetic attachment device include a flux fountain.

An example as described alone or in combination with any of the above or below examples, wherein the display device is configured to support touchscreen functionality.

An example as described alone or in combination with any of the above or below examples, wherein the display modular component is configured to support attachment to a vertical surface including a wall or a cart.

An example as described alone or in combination with any of the above or below examples, wherein the display modular component also includes a processing system and memory configured to execute an operating system when separated from the computing modular component and the processing system of the memory of the computing modular component are configured to provide additional processing and memory resources to the display modular component when physically and communicatively coupled.

In one or more examples, a display modular component comprising: a housing; a display device physically and communicatively coupled to the housing via a hinge, and one or more display hardware elements disposed within the housing and configured to output a display for display by the display device, the housing configured to form a communicative and removable physical coupling to a plurality of other housings having hardware elements disposed therein that are configured to support functionality relating to the display.

A system comprising a plurality of modular components, each of the modular components having a respective housing configured to form a stackable arrangement, one to another, and configured to be physically and communicatively coupled to form a computing device.

In one or more examples, a method comprising: obtaining a plurality a plurality of modular components, each of the modular components having a respective housing configured to form a stackable arrangement, one to another; and stacking the plurality of modular components to form a computing device.

In one or more examples, a computing system comprising: a display device having a housing and a plurality of sensors; a base configured to be placed on a surface; a hinge mechanism that physically connects the base to the housing of the display device, the hinge mechanism including a plurality of clutches; and a rotation control module implemented at least partially in hardware and configured to detect a likelihood using an output of the sensors of whether a user has grasped the display device and in response control operation of the clutches to permit or restrict rotation of the hinge mechanism and thereby control positioning of the display device in relation to the base.

An example as described alone or in combination with any of the above or below examples, wherein the plurality of sensors are capacitive, strain, resistive, or imaging sensors.

An example as described alone or in combination with any of the above or below examples, wherein the display device and housing are configured as a tablet computer capable of independent operation from the base.

An example as described alone or in combination with any of the above or below examples, wherein the rotation control module is configured to prevent configuration which could potentially cause damage to the display device.

An example as described alone or in combination with any of the above or below examples, wherein the rotation control module is configured to permit rotation when grasped by a single hand and permit separation of the display device from the hinge mechanism when grasped by multiple hands.

In one or more examples, a method comprising: detecting that a user has likely grasped a housing of a display device of a computing device using one or more sensors disposed on at least a portion of the display device; responsive to the detecting of the likely grasp, disengaging one or more retention devices that are configured to retain the display device is a set position and thereby permit movement of the display device; detecting that a user has likely ceased the grasping of the housing of the display device of the computing device using one or more sensors disposed on at least a portion of the display device; and responsive to the detecting of the ceasing of the grasp, engaging the one or more retention devices that to retain the display device.

An example as described alone or in combination with any of the above or below examples, wherein the movement includes rotational or sliding movement.

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A computing device comprising:
   a display modular component including a housing, a display device physically and communicatively coupled to the housing via a hinge, and one or more display hardware elements disposed within the housing and configured to output a display for display by the display device; and
   a computing modular component including a housing that is physically and communicatively coupled to the display modular component, a processing system disposed within the housing, and memory disposed within the housing, the processing system configured to execute instructions stored by the processing system to generate a user interface for display by the display device of the display modular component.

2. A computing device as described in claim 1, wherein the computing modular component is configured to be connected to the display modular component via one or more protrusions that are received via cavities for form a mechanical attachment.

3. A computing device as described in claim 2, wherein the mechanical attachment is formed such that off-axis removal causes mechanical binding of the one or more protrusions within respective said cavities.

4. A computing device as described in claim 1, wherein the computing modular component is configured to be connected to the display modular component via magnetic attachment support by a magnetic attachment device.

5. A computing device as described in claim 4, wherein the magnetic attachment device includes a flux fountain.

6. A computing device as described in claim 1, wherein the display modular component and the computing device modular component share a common air conduit that is configured to facilitate heat management of the display modular component and the computing device modular component.

7. A computing device as described in claim 1, wherein the communicative connection is configured such that the computing device modular component is configured to receive power from the display modular component.

8. A computing device as described in claim 1, wherein the display modular component includes one or more inputs that are configured to permit display from a device without the computing modular component being connected to the display modular component.

9. A computing device as described in claim 1, wherein the housings of the display modular component and the computing modular component have a stackable arrangement.

10. A computing device as described in claim 9, wherein the stackable arrangement is configured such that the housing of the computing modular component is configured for placement against a surface and the housing of the display modular component is stacked on top of the housing of the computing modular component.

11. A computing device as described in claim 1, wherein the hinge of the display modular component is configured to support 180 degrees of rotation.

12. A computing device as described in claim 1, wherein the display modular component has a sufficient amount of weight to counteract a weight of the display device such that the display device is rotatable via the hinge without tipping over.

13. A computing device as described in claim 1, wherein the display modular component is configured to be communicatively coupled to a plurality of computing modular components having different functionality, each of the plurality of computing modular components having a different visual characteristic, one to another, indicative of the different respective said functionality.

14. A computing device as described in claim 1, further comprising an accessory modular component including a housing that is configured to be physically and communicatively coupled to the computing modular component.

15. A computing device as described in claim 14, wherein the accessory modular component includes a battery that is configured to power the computing modular component and the display modular component.

16. A computing device as described in claim 15, wherein the battery is chargeable by the computing device, removable, and usable to power a different computing device.

17. A computing device as described in claim 14, wherein the accessory modular component includes an output device.

18. A computing device as described in claim 14, wherein the accessory modular component includes an output device.

19. A computing device as described in claim 1, further comprising a natural user interface modular component including a housing that is configured to be physically and communicatively coupled to the display device of the display modular component.

20. A computing device as described in claim 19, wherein the natural user interface modular component includes a microphone that is configured to detect speech of a user and communicate the speech to the computing modular component to recognize one or more utterances of a user.

* * * * *